United States Patent
Sakamoto et al.

(10) Patent No.: US 7,923,374 B2
(45) Date of Patent: Apr. 12, 2011

(54) METHOD AND APPARATUS FOR PRODUCTION OF METAL FILM OR THE LIKE

(75) Inventors: Hitoshi Sakamoto, Yokohama (JP); Naoki Yahata, Takasago (JP); Toshihiko Nishimori, Takasago (JP); Yoshiyuki Ooba, Yokohama (JP); Hiroshi Tonegawa, Yokohama (JP); Ikumasa Koshiro, Takasago (JP); Yuzuru Ogura, Yokohama (JP)

(73) Assignee: Canon Anelva Corporation, Kawasaki-shi (JP)

(*) Notice: Subject to any disclaimer, the term of this patent is extended or adjusted under 35 U.S.C. 154(b) by 0 days.

(21) Appl. No.: 12/471,743

(22) Filed: May 26, 2009

(65) Prior Publication Data
US 2009/0233442 A1  Sep. 17, 2009

Related U.S. Application Data

(62) Division of application No. 11/132,222, filed on May 19, 2005, now abandoned, which is a division of application No. 10/384,932, filed on Mar. 7, 2003, now Pat. No. 7,208,421.

(30) Foreign Application Priority Data

Mar. 8, 2002  (JP) ................. 2002-063063
Mar. 8, 2002  (JP) ................. 2002-063064
Aug. 7, 2002  (JP) ................. 2002-229413

(51) Int. Cl.
*H01L 21/302* (2006.01)

(52) U.S. Cl. ........... 438/715; 438/714; 438/720; 216/75

(58) Field of Classification Search .......... 438/720, 438/723, 714, 715, 7, 20; 216/75, 76, 67
See application file for complete search history.

(56) References Cited

U.S. PATENT DOCUMENTS 4,851,295 A  7/1989  Brors ................. 428/450
(Continued)

FOREIGN PATENT DOCUMENTS

EP   0 322 466   7/1989
(Continued)

OTHER PUBLICATIONS

Saia, R.J. et al., "The Reactive Ion Etching of Molybdenum and Bi-Layer Metallization Systems Containing Molybdenum," Extended Abstracts, Oct. 19-24, 1986, pp. 475-476, vol. 8602, Abstract No. 317, the Electrochemical Society, Princeton, New Jersey, US.

*Primary Examiner* — Lan Vinh
(74) *Attorney, Agent, or Firm* — Fitzpatrick, Cella, Harper & Scinto

(57) ABSTRACT

In a metal film production apparatus, a copper plate member is etched with a $Cl_2$ gas plasma within a chamber to form a precursor comprising a Cu component and a $Cl_2$ gas; and the temperatures of the copper plate member and a substrate and a difference between their temperatures are controlled as predetermined, to deposit the Cu component of the precursor on the substrate, thereby forming a film of Cu. In this apparatus, $Cl^*$ is formed in an excitation chamber of a passage communicating with the interior of the chamber to flow a $Cl_2$ gas, and the $Cl^*$ is supplied into the chamber to withdraw a $Cl_2$ gas from the precursor adsorbed onto the substrate, thereby promoting a Cu film formation reaction. The apparatus has a high film formation speed, can use an inexpensive starting material, and can minimize impurities remaining in the film.

5 Claims, 17 Drawing Sheets

U.S. PATENT DOCUMENTS

| | | | |
|---|---|---|---|
| 5,059,292 A | 10/1991 | Collins et al. | 204/164 |
| 5,091,209 A | 2/1992 | Claverie et al. | 427/38 |
| 5,110,408 A | 5/1992 | Fujii et al. | 156/643 |
| 5,561,082 A * | 10/1996 | Matsuo et al. | 438/396 |
| 6,001,420 A | 12/1999 | Mosely et al. | 427/258 |
| 6,013,575 A | 1/2000 | Itoh | 438/641 |
| 6,130,482 A | 10/2000 | Iio et al. | 257/774 |
| 6,136,214 A | 10/2000 | Mori et al. | 216/67 |
| 6,181,013 B1 | 1/2001 | Liu et al. | 257/762 |
| 6,287,980 B1 | 9/2001 | Hanazaki et al. | 438/726 |
| 6,323,120 B1 | 11/2001 | Fujikawa et al. | 438/629 |
| 6,331,485 B1 | 12/2001 | Miyamoto | 438/653 |
| 6,436,838 B1 | 8/2002 | Ying et al. | 438/710 |
| 6,537,896 B1 | 3/2003 | Catabay et al. | 438/474 |
| 6,538,324 B1 | 3/2003 | Tagami et al. | 257/751 |
| 6,656,540 B2 * | 12/2003 | Sakamoto et al. | 427/564 |
| 6,713,363 B1 | 3/2004 | Lee | 438/396 |
| 6,812,147 B2 | 11/2004 | Skinner et al. | 438/690 |
| 6,922,382 B2 | 7/2005 | Tseng et al. | 369/47.33 |
| 2001/0019889 A1 | 9/2001 | Sharan et al. | 438/680 |
| 2002/0027292 A1 | 3/2002 | Ueno | 257/774 |
| 2003/0236003 A1 | 12/2003 | Koo et al. | 438/795 |
| 2006/0118046 A1 | 6/2006 | Sakamoto et al. | 118/723 |

FOREIGN PATENT DOCUMENTS

| | | |
|---|---|---|
| EP | 0 337 036 | 10/1989 |
| EP | 0 482 265 | 4/1992 |
| EP | 0 485 265 | 5/1992 |
| EP | 0 808 915 | 11/1997 |
| EP | 1 199 378 | 4/2002 |
| EP | 1 284 305 | 2/2003 |
| EP | 1 312 696 | 5/2003 |
| EP | 1 313 127 | 5/2003 |
| EP | 1 338 674 | 8/2003 |
| WO | WO 01/73159 | 10/2001 |

* cited by examiner

METHOD AND APPARATUS FOR PRODUCTION OF METAL FILM OR THE LIKE

This application is a Divisional of co-pending U.S. application Ser. No. 11/132,222, filed on May 19, 2005, published as U.S. Application Publication No. 2005/0217579 on Oct. 6, 2005, which, in turn, is a Divisional of U.S. application Ser. No. 10/384,932, filed on Mar. 7, 2003, which issued as U.S. Pat. No. 7,208,421 on Apr. 24, 2007, and for which priority is claimed under 35 U.S.C. §120; and this application claims priority of Application Nos. 2002-063063, 2002-063064, and 2002-229413 filed in Japan on Mar. 8, 2002; Mar. 8, 2002; and Aug. 7, 2002; respectively, under 35 U.S.C. §119; the entire contents of all are hereby incorporated by reference.

BACKGROUND OF THE INVENTION

1. Field of the Invention

This invention relates to a method and an apparatus for production of a metal film or the like. More particularly, the invention relates to the method and the apparatus useful when applied in producing a film of a high vapor pressure halide-forming metal by etching an etched member formed from the metal with a halogen-containing source gas plasma under predetermined conditions; and in forming an interconnection structure comprising the film of the metal.

The present invention further relates to the method and the apparatus useful when applied in producing a film of a composite metal by etching an etched member having a plurality of metals with a source gas plasma containing a halogen, in particular.

2. Description of the Related Art

In producing a metal film, for example, a thin film of copper, by vapor phase deposition, it has been common practice to use an organometallic complex of a liquid, for example, copper-hexafluoroacetylacetonato-trimethylvinyl-silane, as a starting material, dissolve the solid starting material in a solvent, and vaporize the solution by use of a thermal reaction to form a film on a substrate.

High speed semiconductor devices have increasingly used copper, instead of a conventional aluminum alloy, as a material for their interconnection in order to increase the speed of switching, decrease transmission losses, and achieve a high density. In this case, a predetermined interconnection structure is formed by performing vapor phase deposition or plating on an insulating substrate (e.g., $SiO_2$) having depressions for interconnection, such as trenches or holes (via holes), on its surface, thereby adhering copper onto the surface of the substrate, including the depressions.

In producing a thin film of copper by vapor phase deposition, it has been common practice to use an organometallic complex of a liquid, for example, copper-hexafluoroacetylacetonato-trimethylvinylsilane, as a starting material, dissolve the solid starting material in a solvent, and vaporize the solution by use of a thermal reaction to form a film on the substrate.

The damascene method is frequently used in forming a predetermined copper interconnection structure by burying copper in the depressions of the substrate. The damascene method is a technique which cuts trenches in an insulating film, buries copper, an interconnection material, in the so formed trenches by use of vapor phase deposition or plating, and removes a surplus thin copper film outside the trenches by CMP (chemical and mechanical polishing) to obtain a predetermined interconnection structure.

With the above-mentioned earlier film formation technologies, it has been difficult to increase the speed of film formation, because the film is formed with the use of a thermal reaction. Moreover, the metal complex as the starting material is expensive. In addition, hexafluoroacetylacetonato and trimethylvinylsilane accompanying copper remain as impurities in the thin film of copper, presenting difficulty in improving the quality of the film.

On the other hand, the above-described interconnection structure obtained by the earlier technologies is formed by adhesion of a thin copper film on the surface of the substrate, thus posing the problem that the burial characteristics of copper are poor. In recent years, the width of the interconnection has tended to become smaller. In response, the holes need to be decreased in diameter. As a result, the aspect ratio, the ratio of the depth to the diameter of the hole, must be minimized. For this purpose as well, it is an urgent task to improve the burial characteristics.

Moreover, the interconnection structure obtained by the earlier technologies comprises relatively small copper crystal grains, so that many grain boundaries exist among the grains. Thus, electromigration is liable to cause a local high-resistance portion in the grain boundary or the defective site, and in the worst case, poses the problem that this portion is broken by Joule's heat. At the same time, stress migration due to residual stress produced during burial of the copper film in the depression may lead to physical breakage.

With the above-mentioned vapor phase deposition method, moreover, it has been difficult to increase the speed of film formation, because the film is formed with the use of a thermal reaction. Besides, the metal complex as the starting material is expensive. In addition, hexafluoroacetylacetonato and trimethylvinylsilane accompanying copper remain as impurities in the thin film of copper, making it difficult to improve the quality of the film.

In forming the interconnection by the damascene method, there is also the problem that the CMP step is absolutely necessary, requiring a long time for the formation of the interconnection structure. This is a major drawback with a multilayer interconnection structure which has tended to be increasingly used in recent years. The reason is that a single-layer interconnection structure can be formed by the single damascene method, while a two-layer interconnection structure can only be formed by the double damascene method requiring the same procedure to be performed twice, meaning that as the number of the layers increases, the number of the CMP steps performed increases proportionally.

SUMMARY OF THE INVENTION

The present invention has been accomplished in the light of the earlier technologies. It is a first object of the invention to provide a metal film production method and a metal film production apparatus which have a high film formation speed, which can use an inexpensive starting material, and which can minimize impurities remaining in the film.

A second object of the present invention is to provide an interconnection structure, and a method and an apparatus for its formation, which have a high film formation speed, which can use an inexpensive starting material, which can minimize impurities remaining in the film, which ensure satisfactory burial in the depression, which can afford satisfactory electrical characteristics stable for a long term, and which can minimize the steps for production of the interconnection structure by a metal film.

The present inventors obtained the following findings: A chlorine gas is supplied into a vacuum chamber accommodating a substrate. The chlorine gas is converted into a plasma by plasma generation means, and an etched member comprising a copper plate disposed within the chamber is etched with the chlorine gas plasma. By appropriately controlling the relation between the temperatures of the copper plate and the substrate, the etched copper is deposited on the substrate, whereby a thin film of copper can be formed. That is, the thin copper film can be formed on the substrate by imparting a high temperature (e.g., 300° C. to 400° C.) to the copper plate, the etched member, and imparting a low temperature (about 200° C.) to the substrate.

Hence, the copper plate is disposed so as to face the chlorine gas plasma forming a relatively high temperature atmosphere, while the substrate is disposed in a relatively low temperature atmosphere opposed to the copper plate, with the plasma atmosphere being interposed between the substrate and the copper plate. Also, the temperatures of the copper plate and the substrate are controlled appropriately. By taking these measures, a production apparatus for a thin Cu film can be easily provided.

As the etched member, not only Cu, but also a metal forming a high vapor pressure halide, such as Ta, Ti, W, Zn, In or Cd, can be used generally. A composite metal containing a plurality of these metals, such as an alloy of In and Cu, can also be used as the etched member. Moreover, a composite metal containing a nonmetallic element, such as S or Se, in addition to the above metal, for example, an alloy such as $CuInSe_2$, CdS, or ZnSe, may also be used as the etched member. As the source gas, any halogen gas can be used generally, in addition to $Cl_2$.

In the above-described production apparatus for the thin Cu film, the following reactions are assumed to occur:

Dissociation reaction of plasma: $Cl_2 \rightarrow 2Cl^*$

Etching reaction: $Cu+Cl^* \rightarrow CuCl(g)$

Adsorption to substrate: $CuCl(g) \rightarrow CuCl(ad)$

Film formation reaction: $CuCl(ad)+Cl^* \rightarrow Cu+Cl_2 \leftarrow$ \hfill (1)

Here, Cl* represents radicals of Cl, (g) represents a gaseous state, and (ad) represents an adsorbed state.

In the equation (1), if Cl* exists amply, the reaction proceeds to the right, whereupon the Cu film can be deposited satisfactorily. However, $Cl_2$ and $Cl^+$ are present mixedly in the Cl gas plasma, and Cl* does not occur preferentially. Thus, only the reaction of the equation (1) does not proceed, but a reaction proceeding to the left occurs at the same time. Furthermore, the Cu film, once formed, may be etched.

In addition, $Cl_2$ cannot be withdrawn sufficiently from CuCl(ad), so that the following reaction may develop: $CuCl(ad) \rightarrow CuCl(s)$ That is, CuCl in solid form is formed. This CuCl(s) is an insulator. Thus, the presence of CuCl(s) in the Cu film constitutes the cause of decreasing the electrical conductivity of the resulting Cu film, deteriorating the quality of the film.

Under these circumstances, it is necessary to realize the metal film production method based on the aforementioned findings satisfactorily, improve the quality of the film, and increase the film formation speed at the same time. For these purposes, the first measure to be taken is to replenish Cl* separately so that there will be an ample amount of Cl* within the chamber. This can be done by generating a high density of Cl* in a separate space of a smaller volume than the chamber, and supplying it into the chamber. This is because the space of a smaller volume makes it easy to control plasma conditions so that Cl* will be generated.

Another film formation reaction, expressed by the following equation (2), may be taking place:

$$2CuCl(ad) \rightarrow 2Cu+Cl_2 \qquad (2)$$

The equation (2) represents a reaction in which CuCl (ad) receives thermal energy to deposit Cu and release a $Cl_2$ gas. This is a reversible reaction which is possible from the aspect of thermal equilibrium. In the equation (2), if the amount of $Cl_2$ is decreased, the reaction proceeds rightward. For this purpose, dissociation of the $Cl_2$ gas suffices.

Under these circumstances, a second measure can be taken to satisfactorily realize the metal film production method based on the aforementioned findings, further improve the quality of the film, and further increase the film formation speed at the same time. The second measure is to increase the dissociation rate of the $Cl_2$ gas so that the amount of the $Cl_2$ gas occurring in accordance with the film formation reaction will be decreased. This can be accomplished basically by adjusting the plasma conditions.

A first metal film production method according to the present invention focuses on the film formation reaction of the aforementioned equation (1), and attains the objects of the invention by utilizing an etching phenomenon under predetermined temperature control based on the aforesaid findings, while making the effects of the invention more remarkable by supplying separately formed radicals of the source gas. The first metal film production method is characterized by the following features:

1) A metal film production method which comprises disposing an etched member, formed from a metal forming a high vapor pressure halide, in a chamber accommodating a substrate in an interior thereof; etching the etched member with a source gas plasma containing a halogen within the chamber to form a precursor comprising a metallic component and a source gas; and controlling the temperatures of the etched member and the substrate so as to be predetermined temperatures and so as to provide a predetermined temperature difference between the temperatures, thereby depositing the metallic component of the precursor on the substrate to perform predetermined film formation, the metal film production method further comprising:
separately generating radicals of the source gas; and
replenishing the interior of the chamber with the source gas radicals to extract the source gas from the precursor adsorbed onto the substrate, thereby depositing the metallic component on the substrate for performing the predetermined film formation.

Thus, the following basic actions and effects are obtained: The use of the source gas plasma results in a markedly increased reaction efficiency and a fast film formation speed. Since the halogen gas is used as the source gas, moreover, the cost can be markedly decreased. Furthermore, the desired film formation can be carried out under temperature control. Thus, the amounts of impurities, such as chlorine, remaining in the thin metal film can be decreased, so that a high quality thin metal film can be produced.

Besides, film formation can be promoted by the action of separately formed radicals of the source gas, whereby the film formation speed can be increased.

2) In the metal film production method described in 1), the radicals of the source gas may be obtained by applying a high frequency electric field to the source gas flowing through a tubular passage communicating with the interior of the chamber to convert the source gas into a plasma. Thus, the effects of the feature described in 1) can be obtained by a simple apparatus.

3) In the metal film production method described in 1), the radicals of the source gas may be obtained by supplying microwaves to the source gas flowing through a tubular passage communicating with the interior of the chamber to convert the source gas into a plasma. Thus, electromagnetic waves of a higher frequency than in the feature described in 2) can be used. The source gas radicals can be obtained with higher density and higher efficiency accordingly.

4) In the metal film production method described in 1), the radicals of the source gas may be obtained by heating the source gas flowing through a tubular passage communicating with the interior of the chamber to dissociate the source gas thermally. Thus, the effects of the feature described in 1) can be obtained at the lowest cost.

5) In the metal film production method described in 1), the radicals of the source gas may be obtained by supplying electromagnetic waves, such as laser light or electron beams, to the source gas flowing through a tubular passage communicating with the interior of the chamber to dissociate the source gas. Thus, desired radicals can be obtained selectively with high efficiency by selecting and fixing the wavelength of the electromagnetic waves. Consequently, the effects of the feature described in 1) can be rendered remarkable.

A second metal film production method according to the present invention focuses on the film formation reaction of the aforementioned equation (2), and attains the objects of the invention by utilizing an etching phenomenon under predetermined temperature control based on the aforesaid findings, while making the effects of the invention more remarkable by increasing the dissociation rate of the source gas adsorbed onto the substrate. The second metal film production method is characterized by the following features:

6) A metal film production method which comprises disposing an etched member, formed from a metal forming a high vapor pressure halide, in a chamber accommodating a substrate in an interior thereof; etching the etched member with a source gas plasma containing a halogen within the chamber to form a precursor comprising a metallic component and a source gas; and controlling the temperatures of the etched member and the substrate so as to be predetermined temperatures and so as to provide a predetermined temperature difference between the temperatures, thereby depositing the metallic component of the precursor on the substrate to perform predetermined film formation, the metal film production method further comprising: controlling plasma conditions such that the dissociation rate of the source gas occurring according to a film formation reaction increases.

Thus, in addition to the same basic actions and effects as in the feature described in 1), the increase in the dissociation rate of the source gas can promote film formation, increasing its speed.

7) In the metal film production method described in 6), control of the plasma conditions may be realized by decreasing the amount of the source gas supplied. Thus, the effects of the feature described in 6) can be achieved most easily.

8) In the metal film production method described in 6), control of the plasma conditions may be realized by increasing the amount of a high frequency electric power for forming the source gas plasma. Thus, the effects of the feature described in 6) can be achieved easily without decreasing the film formation rate.

9) In the metal film production method described in 6), control of the plasma conditions may be realized by supplying a rare gas, having a mass equal to or larger than the mass of Ne, into the chamber in addition to the source gas. Thus, the rare gas functions as a catalyst for increasing the dissociation rate, and thus can easily increase the dissociability of the source gas.

10) In the metal film production method described in 6), control of the plasma conditions may be realized by supplying electromagnetic waves into the chamber to dissociate the source gas supplied into the chamber. Thus, the dissociation of the source gas can be performed with high efficiency by the energy of electromagnetic waves.

A first metal film production apparatus for realizing the aforementioned first metal film production method is characterized by the following features:

11) A metal film production apparatus, comprising:
a cylindrical chamber accommodating a substrate;
an etched member formed from a metal, which forms a high vapor pressure halide, and disposed within the chamber at a position opposed to the substrate;
source gas supply means for supplying a source gas containing a halogen to an interior of the chamber between the substrate and the etched member;
film forming plasma generation means which converts the source gas, which has been supplied to the interior of the chamber, into a plasma upon supply of a high frequency electric power to form a source gas plasma within the chamber in order to etch the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
source gas radical replenishment means for replenishing the interior of the chamber with radicals of the source gas.

Thus, the following basic actions and effects are obtained: The use of the source gas plasma results in a markedly increased reaction efficiency and a fast film formation speed. Since the halogen gas is used as the source gas, moreover, the cost can be markedly decreased. Furthermore, the desired film formation can be carried out under temperature control. Thus, the amounts of impurities, such as chlorine, remaining in the thin metal film can be decreased, so that a high quality thin metal film can be produced. Moreover, these actions and effects can be obtained by a so-called inductively coupled apparatus.

Besides, film formation can be promoted by the action of separately formed radicals of the source gas, whereby the film formation speed can be increased.

12) A metal film production apparatus, comprising:
a cylindrical chamber accommodating a substrate;
an etched member formed from a metal, which forms a high vapor pressure halide, and disposed within the chamber at a position opposed to the substrate;
source gas plasma supply means for forming a source gas plasma containing a halogen outside the chamber, and supplying the source gas plasma to an interior of the chamber between the substrate and the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and source gas radical replenishment means for replenishing the interior of the chamber with radicals of the source gas.

Thus, the same actions and effects as in the feature described in 11) can be achieved by a so-called remote plasma apparatus designed to supply a remotely formed plasma into the chamber.

13) A metal film production apparatus, comprising:
a cylindrical chamber accommodating a substrate;
an etched member formed from a metal, which forms a high vapor pressure halide, and disposed within the chamber at a position other than a position opposed to the substrate;
a shielding plate disposed within the chamber between the substrate and the etched member and having a hole directed toward the substrate;
source gas supply means for supplying a source gas containing a halogen to an interior of the chamber between the etched member and the shielding plate;
film forming plasma generation means which converts the source gas, which has been supplied to the interior of the chamber, into a plasma upon supply of a high frequency electric power to form a source gas plasma within the chamber in order to etch the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
source gas radical replenishment means for replenishing the interior of the chamber with radicals of the source gas.

Thus, the same effects as in the feature described in 11) are produced. Furthermore, particles, which are peeled from the etched member after etching and fall, are prevented from adhering onto the substrate, and the predetermined precursor can be supplied to the space above the substrate. The precursor can easily pass through the hole of the shielding plate, while a low proportion of the radicals formed in the space between the etched member and the shielding plate pass through the hole and arrive at the space above the substrate. In this view, the contribution of replenishment of the radicals to the promotion of the film formation reaction can be rendered remarkable.

14) In the metal film production apparatus described in any one of 11), 12) and 13), the source gas radical replenishment means may supply a high frequency electric current to a coil wound round a tubular passage communicating with the interior of the chamber for flowing the source gas, and convert the source gas into a plasma by the action of an electric field formed by supply of the high frequency electric current. Thus, the source gas radical replenishment means of the features described in 11) to 13) can be accomplished by a simple construction.

15) In the metal film production apparatus described in any one of 11), 12) and 13), the source gas radical replenishment means may have microwave supply means in a tubular passage communicating with the interior of the chamber for flowing the source gas, and convert the source gas into a plasma by the action of microwaves generated by the microwave supply means. Thus, the source gas radical replenishment means of the features described in 11) to 13) can show a higher efficiency than in the feature described in 14).

16) In the metal film production apparatus described in any one of 11), 12) and 13), the source gas radical replenishment means may have heating means for heating the source gas flowing through a tubular passage communicating with the interior of the chamber to dissociate the source gas thermally. Thus, the source gas radical replenishment means of the features described in 11) to 13) can be constructed at the lowest cost.

17) In the metal film production apparatus described in any one of 11), 12) and 13), the source gas radical replenishment means may have electromagnetic wave generation means for supplying electromagnetic waves, such as laser light or electron beams, to the source gas flowing through a tubular passage communicating with the interior of the chamber to dissociate the source gas. Thus, the source gas radical replenishment means of the features described in 11) to 13) can be constructed as an apparatus capable of forming desired radicals selectively with high efficiency.

A second metal film production apparatus for realizing the aforementioned second metal film production method is characterized by the following features:

18) A metal film production apparatus, comprising:
a cylindrical chamber accommodating a substrate;
an etched member formed from a metal, which forms a high vapor pressure halide, and disposed within the chamber at a position opposed to the substrate;
source gas supply means for supplying a source gas containing a halogen to an interior of the chamber between the substrate and the etched member;
film forming plasma generation means which converts the source gas, which has been supplied to the interior of the chamber, into a plasma upon supply of a high frequency electric power to form a source gas plasma within the chamber in order to etch the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
rare gas supply means for supplying a rare gas, which has a mass equal to or larger than the mass of Ne, into the chamber in addition to the source gas.

Thus, in a so-called inductively coupled apparatus, the catalytic function of the rare gas for the dissociation rate of the source gas can satisfactorily increase the dissociation rate, promoting the film formation reaction.

19) A metal film production apparatus, comprising:
a cylindrical chamber accommodating a substrate;
an etched member formed from a metal, which forms a high vapor pressure halide, and disposed within the chamber at a position opposed to the substrate;
source gas plasma supply means for forming a source gas plasma containing a halogen outside the chamber, and supplying the source gas plasma to an interior of the chamber between the substrate and the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
rare gas supply means for supplying a rare gas, which has a mass equal to or larger than the mass of Ne, into the chamber in addition to the source gas.

Thus, in a so-called remote plasma apparatus, the catalytic function of the rare gas for the dissociation rate of the source gas can satisfactorily increase the dissociation rate, promoting the film formation reaction.

20) A metal film production apparatus, comprising:
a cylindrical chamber accommodating a substrate;
an etched member formed from a metal, which forms a high vapor pressure halide, and disposed within the chamber at a position other than a position opposed to the substrate;
a shielding plate disposed within the chamber between the substrate and the etched member and having a hole directed toward the substrate;
source gas supply means for supplying a source gas containing a halogen to an interior of the chamber between the etched member and the shielding plate;
film forming plasma generation means which converts the source gas, which has been supplied to the interior of the chamber, into a plasma upon supply of a high frequency electric power to form a source gas plasma within the chamber in order to etch the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
rare gas supply means for supplying a rare gas, which has a mass equal to or larger than the mass of Ne, into the chamber in addition to the source gas.

Thus, in the same apparatus as described in 13) designed to prevent particles of the etched member from falling onto the substrate, the catalytic function of the rare gas for the dissociation rate of the source gas can satisfactorily increase the dissociation rate, promoting the film formation reaction.

21) A metal film production apparatus, comprising:
a cylindrical chamber accommodating a substrate;
an etched member formed from a metal, which forms a high vapor pressure halide, and disposed within the chamber at a position opposed to the substrate;
source gas supply means for supplying a source gas containing a halogen to an interior of the chamber between the substrate and the etched member;
film forming plasma generation means which converts the source gas, which has been supplied to the interior of the chamber, into a plasma upon supply of a high frequency electric power to form a source gas plasma within the chamber in order to etch the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
electromagnetic wave generation means for supplying electromagnetic waves into the chamber to dissociate the source gas generated in accordance with a film formation reaction.

Thus, in a so-called inductively coupled apparatus, the source gas occurring in accordance with the film formation reaction is dissociated by electromagnetic waves, whereby the film formation reaction can be promoted.

22) A, metal film production apparatus, comprising:
a cylindrical chamber accommodating a substrate;
an etched member formed from a metal, which forms a high vapor pressure halide, and disposed within the chamber at a position opposed to the substrate;
source gas plasma supply means for forming a source gas plasma containing a halogen outside the chamber, and supplying the source gas plasma to an interior of the chamber between the substrate and the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
electromagnetic wave generation means for supplying electromagnetic waves into the chamber to dissociate the source gas generated in accordance with a film formation reaction.

Thus, in a so-called remote plasma apparatus, the source gas occurring in accordance with the film formation reaction is dissociated by electromagnetic waves, whereby the film formation reaction can be promoted.

23) A metal film production apparatus, comprising:
a cylindrical chamber accommodating a substrate;
an etched member formed from a metal, which forms a high vapor pressure halide, and disposed within the chamber at a position other than a position opposed to the substrate;
a shielding plate disposed within the chamber between the substrate and the etched member and having a hole directed toward the substrate;
source gas supply means for supplying a source gas containing a halogen to an interior of the chamber between the etched member and the shielding plate;
film forming plasma generation means which converts the source gas, which has been supplied to the interior of the chamber, into a plasma upon supply of a high frequency electric power to form a source gas plasma within the chamber in order to etch the etched member;
temperature control means for controlling the temperature of the substrate to a predetermined temperature, which is lower than the temperature of the etched member, to deposit a metallic component on the substrate from a precursor comprising the metallic component and the source gas and obtained as a result of etching of the etched member by the source gas plasma, thereby performing predetermined film formation; and
electromagnetic wave generation means for supplying electromagnetic waves into the chamber to dissociate the source gas generated in accordance with a film formation reaction.

Thus, in the same apparatus as described in 13) designed to prevent particles of the etched member from falling onto the substrate, the source gas occurring in accordance with the film formation reaction is dissociated, whereby the film formation reaction can be promoted.

A third metal film production method is characterized by the following feature:

24) A metal film production method comprising:
disposing an etched member, formed from a composite metal comprising a plurality of metallic components forming high vapor pressure halides, in a chamber accommodating a substrate in an interior thereof;
etching the etched member with a source gas plasma containing a halogen within the chamber to form a plurality of precursors comprising the metallic components and a source gas; and controlling the temperatures of the etched member and the substrate so as to be predetermined temperatures and so as to provide a predetermined temperature difference between the temperatures, thereby depositing the metallic components of the plurality of precursors on the substrate to perform predetermined film formation.

Thus, various thin films adapted for applications can be prepared, and this method can be used as a metal film production method of great versatility.

A fourth metal film production method is characterized by the following feature:

25) A metal film production method comprising:

disposing an etched member, formed from a composite metal comprising one or more metallic components and one or more nonmetallic components forming high vapor pressure halides, in a chamber accommodating a substrate in an interior thereof;

etching the etched member with a source gas plasma containing a halogen within the chamber to form one or more precursors comprising the metallic components and a source gas and one or more precursors comprising the nonmetallic components and the source gas; and controlling the temperatures of the etched member and the substrate so as to be predetermined temperatures and so as to provide a predetermined temperature difference between the temperatures, thereby depositing the metallic components and the nonmetallic components simultaneously on the substrate to perform predetermined film formation.

Thus, various thin films adapted for applications can be prepared, and this method can be used as a metal film production method of great versatility.

A third metal film production apparatus for realizing the aforementioned third metal film production method is characterized by the following features:

26) A metal film production apparatus, comprising:

a cylindrical chamber accommodating a substrate;

an etched member formed from a composite metal, which comprises a plurality of metallic components forming high vapor pressure halides, and disposed within the chamber at a position opposed to the substrate;

source gas supply means for supplying a source gas containing a halogen to an interior of the chamber between the substrate and the etched member;

film forming plasma generation means which converts the source gas, which has been supplied to the interior of the chamber, into a plasma upon supply of a high frequency electric power to form a source gas plasma within the chamber in order to etch the etched member; and temperature control means for controlling the temperature of the substrate to a predetermined temperature, which is lower than the temperature of the etched member, to deposit the plurality of metallic components on the substrate from a plurality of precursors comprising the metallic components and the source gas and obtained as a result of etching of the etched member by the source gas plasma, thereby performing predetermined film formation.

Thus, this apparatus can prepare various thin films adapted for applications, and can be used as a metal film production apparatus of great versatility.

27) A metal film production apparatus, comprising:

a cylindrical chamber accommodating a substrate;

an etched member formed from a composite metal, which comprises a plurality of metallic components forming high vapor pressure halides, and disposed within the chamber at a position opposed to the substrate;

source gas plasma supply means for forming a source gas plasma containing a halogen outside the chamber, and supplying the source gas plasma to an interior of the chamber between the substrate and the etched member; and temperature control means for controlling the temperature of the substrate to a predetermined temperature, which is lower than the temperature of the etched member, to deposit the plurality of metallic components on the substrate from a plurality of precursors comprising the metallic components and a source gas and obtained as a result of etching of the etched member by the source gas plasma, thereby performing predetermined film formation.

Thus, this apparatus can prepare various thin films adapted for applications, and can be used as a metal film production apparatus of great versatility.

A fourth metal film production apparatus for realizing the aforementioned fourth metal film production method is characterized by the following features:

28) A metal film production apparatus, comprising:

a cylindrical chamber accommodating a substrate;

an etched member formed from a composite metal, which comprises one or more metallic components and one or more nonmetallic components forming high vapor pressure halides, and disposed within the chamber at a position opposed to the substrate;

source gas supply means for supplying a source gas containing a halogen to an interior of the chamber between the substrate and the etched member;

film forming plasma generation means which converts the source gas, which has been supplied to the interior of the chamber, into a plasma upon supply of a high frequency electric power to form a source gas plasma within the chamber in order to etch the etched member; and temperature control means for controlling the temperature of the substrate to a predetermined temperature, which is lower than the temperature of the etched member, to deposit the metallic components and the nonmetallic components simultaneously on the substrate from one or more precursors comprising the metallic components and the source gas and one or more precursors comprising the nonmetallic components and the source gas obtained as a result of etching of the etched member by the source gas plasma, thereby performing predetermined film formation.

Thus, this apparatus can prepare various thin films adapted for applications, and can be used as a metal film production apparatus of great versatility.

29) A metal film production apparatus, comprising:

a cylindrical chamber accommodating a substrate;

an etched member formed from a composite metal, which comprises one or more metallic components and one or more nonmetallic components forming high vapor pressure halides, and disposed within the chamber at a position opposed to the substrate;

source gas plasma supply means for forming a source gas plasma containing a halogen outside the chamber, and supplying the source gas plasma to an interior of the chamber between the substrate and the etched member; and temperature control means for controlling the temperature of the substrate to a predetermined temperature, which is lower than the temperature of the etched member, to deposit the metallic components and the nonmetallic components simultaneously on the substrate from one or more precursors comprising the metallic components and a source gas and one or more precursors comprising the nonmetallic components and the source gas obtained as a result of etching of the etched member by the source gas plasma, thereby performing predetermined film formation.

Thus, this apparatus can prepare various thin films adapted for applications, and can be used as a metal film production apparatus of great versatility.

A fifth metal film production method, which applies the aforementioned first or second metal film production method to achieve the production of a thin film of a composite metal, is characterized by the following feature:

30) In the metal film production method described in any one of 1) to 10), the etched member formed from the metal may be formed from a composite metal comprising a plurality of metallic components, and the predetermined film formation may be performed by depositing the plurality of metallic components on the substrate from a plurality of the precursors comprising the metallic components and the source gas which have been obtained as a result of etching of the etched member by the source gas plasma.

Thus, this method can prepare various thin films adapted for applications, and can be used as a metal film production method of great versatility.

A fifth metal film production apparatus for realizing the aforementioned fifth metal film production method is characterized by the following feature:

31) In the metal film production apparatus described in any one of 11) to 23), the etched member formed from the metal may be formed from a composite metal comprising a plurality of metallic components, and the predetermined film formation may be performed by depositing the plurality of metallic components on the substrate from a plurality of the precursors comprising the metallic components and the source gas which have been obtained as a result of etching of the etched member by the source gas plasma.

Thus, this apparatus can prepare various thin films adapted for applications, and can be used as a metal film production apparatus of great versatility.

A sixth metal film production method, which applies the aforementioned first or second metal film production method to achieve the production of a thin film of a composite metal, is characterized by the following feature:

32) In the metal film production method described in any one of 1) to 10), the etched member formed from the metal may be formed from a composite metal comprising one or more metallic components and one or more nonmetallic components, and the predetermined film formation may be performed by depositing the metallic components and the nonmetallic components simultaneously on the substrate from one or more of the precursors comprising the metallic components and the source gas and one or more of the precursors comprising the nonmetallic components and the source gas which have been obtained as a result of etching of the etched member by the source gas plasma.

Thus, this method can prepare various thin films adapted for applications, and can be used as a metal film production method of great versatility.

A sixth metal film production apparatus for realizing the aforementioned sixth metal film production method is characterized by the following feature:

33) In the metal film production apparatus described in any one of 11) to 23), the etched member formed from the metal may be formed from a composite metal comprising one or more metallic components and one or more nonmetallic components, and the predetermined film formation may be performed by depositing the metallic components and the nonmetallic components simultaneously on the substrate from one or more of the precursors comprising the metallic components and the source gas and one or more of the precursors comprising the nonmetallic components and the source gas which have been obtained as a result of etching of the etched member by the source gas plasma.

Thus, this apparatus can prepare various thin films adapted for applications, and can be used as a. metal film production apparatus of great versatility.

During the film formation reaction shown in the aforementioned equation (1), as stated earlier, an etching reaction for the deposited Cu film by means of Cl* simultaneously occurs, in addition to this film formation reaction. That is, if a proper amount of Cl* acts on CuCl(ad), the Cu film is deposited by the film formation reaction shown in the equation (1). In an atmosphere in which Cl* is present at a high density, the etching of the deposited Cu film with Cl* is predominant, making growth of the Cu film impossible. This means that control of the amount of Cl* enables either the film formation reaction or the etching reaction to be selected. Thus, if it is possible to create an atmosphere in which the speed of the film formation reaction is slightly higher than the speed of the etching reaction, it may be considered to work out a film formation method in which the Cu film is deposited by the film formation reaction, and simultaneously the surface of the Cu film is etched, while the film thickness is gradually increased. That is, even if the depression of the substrate is a via hole with a very small diameter, Cu can be sequentially stacked, starting at its bottom, to form the Cu film. At this time, the surface of the stacked Cu film is etched with Cl*. Thus, stacking of the Cu film proceeds, with the intrinsic surface of the Cu film being always exposed, and with the crystal directions being unified into a single direction. The Cu film, which is formed in the depression of the substrate by film formation in this copresence of the film formation reaction and the etching reaction, is satisfactory in the adhesion of the film itself. Also, this Cu film comprises a single crystal, or a crystal composed of large crystal grains bound together which is regarded as equivalent to a single crystal (both types of crystals are collectively called a single crystal-like crystal). Such a single crystal-like crystal has no grain boundaries, or has several grain boundaries, if any. Thus, the Cu film is not affected by electromigration or stress migration, but can be expected to show stable electrical characteristics for a long period.

The interconnection structure according to the present invention, accomplished based on the foregoing findings, is characterized by the following:

34) An interconnection structure formed by burying a metal film in a depression, such as a trench or a hole, formed in a substrate, the interconnection structure being formed by:

making a film formation reaction and an etching reaction coexistent, the film formation reaction being a reaction in which a precursor comprising a metallic component and a source gas is adsorbed onto the substrate, and then the metallic component is deposited to form a. metal film of a metal of the metallic component, and the etching reaction being a reaction in which the metal film formed by the film formation reaction is etched with a plasma of the source gas; and exercising control such that the speed of the film formation reaction is higher than the speed of the etching reaction, thereby stacking the metal film in the depression sequentially, starting at a bottom of the depression.

Hence, simultaneously with the deposition of the metal film by the film formation reaction, the surface of the metal film is etched, and the film thickness is gradually increased, with the result that the interconnection structure is formed. That is, even if the depression of the substrate is a via hole with a very small diameter, for example, the metal can be sequentially stacked, starting at its bottom, to form the metal film. At this time, the surface of the stacked metal film is etched with the source gas plasma. Thus, stacking of the metal film proceeds, with the intrinsic surface of the metal film being always exposed, and with the crystal directions being unified into a single direction.

Thus, the resulting interconnection structure has by far better burial characteristics than the interconnection structures formed by vapor phase deposition and plating according to the earlier technologies. The metal film itself is satisfactory in adhesion, and also comprises a single crystal, or a single crystal-like crystal composed of large crystal grains bound together which can be regarded as equivalent to a single crystal. Such a single crystal-like crystal has no grain boundaries, or has several grain boundaries, if any. Thus, the interconnection structure is not affected by electromigration or stress migration, but can maintain stable electrical characteristics for a long period.

35) A multilayer interconnection structure formed by burying a metal film in a depression, such as a trench or a hole, in multiple layers formed in a substrate for formation of the multilayer interconnection structure, the multilayer interconnection structure being integrally formed by:

making a film formation reaction and an etching reaction coexistent, the film formation reaction being a reaction in which a precursor comprising a metallic component and a source gas is adsorbed onto the substrate, and then the metallic component is deposited to form a metal film of a metal of the metallic component, and the etching reaction being a reaction in which the metal film formed by the film formation reaction is etched with a plasma of the source gas; and exercising control such that the speed of the film formation reaction is higher than the speed of the etching reaction, thereby stacking the metal film in the depression sequentially, starting at a bottom of the depression.

Thus, the multilayer interconnection structure can be formed as an integrally continued single crystal-like crystal of the metal. Consequently, the actions and effects described in 34) above are even more remarkable than in the earlier technologies.

36) In the multilayer interconnection structure described in 35), a barrier metal layer may be formed on the surface of the depression of the substrate.

Thus, the multilayer interconnection structure can be formed as an integrally continued single crystal-like crystal of the metal, and the barrier metal layer necessarily formed between the interconnection structures of the respective layers in the earlier technologies can be removed. Consequently, the metals forming the interconnection structures of the respective layers are not divided by the barrier metal layer, and a rise in resistivity at this site can be eliminated. Thus, the electrical characteristics of the interconnection structure can be improved accordingly.

37) In the multilayer interconnection structure described in any one of 34) to 36), the metal film may be formed by a metal film production apparatus, which disposes an etched member, formed from a metal forming a high vapor pressure halide, in a chamber accommodating the substrate in an interior thereof; etches the etched member with a source gas plasma containing a halogen within the chamber to form the precursor comprising the metallic component and the source gas; and controls the temperatures of the etched member and the substrate so as to be predetermined temperatures and so as to provide a predetermined temperature difference between the temperatures, thereby depositing the metallic component of the precursor on the substrate to perform predetermined film formation.

Thus, the interconnection structure described in 34) to 36) can be formed easily and reliably.

The interconnection structure forming method according the present invention, based on the aforementioned findings, is characterized by the following:

38) An interconnection structure forming method for forming an interconnection by burying a metal film in a depression, such as a trench or a hole, formed in a substrate, comprising: making a film formation reaction and an etching reaction coexistent, the film formation reaction being a reaction in which a precursor comprising a metallic component and a source gas is adsorbed onto the substrate, and then the metallic component is deposited to form a metal film of a metal of the metallic component, and the etching reaction being a reaction in which the metal film formed by the film formation reaction is etched with a plasma of the source gas; and exercising control such that the speed of the film formation reaction is higher than the speed of the etching reaction, thereby stacking the metal film in the depression sequentially, starting at a bottom of the depression, to form a predetermined interconnection.

Thus, the interconnection structure described in 34) can be formed easily and reliably. In forming it, the relation between the film formation speed and the etching speed is controlled, thereby obviating the CMP step, the essential step in the damascene method according to the earlier technologies. In this case, the manufacturing cost and time can be dramatically reduced.

39) A multilayer interconnection structure forming method for forming an interconnection by burying a metal film in a depression, such as a trench or a hole, in multiple layers formed in a substrate for formation of the multilayer interconnection structure, comprising: making a film formation reaction and an etching reaction coexistent, the film formation reaction being a reaction in which a precursor comprising a metallic component and a source gas is adsorbed onto the substrate, and then the metallic component is deposited to form a metal film of a metal of the metallic component, and the etching reaction being a reaction in which the metal film formed by the film formation reaction is etched with a plasma of the source gas; and exercising control such that the speed of the film formation reaction is higher than the speed of the etching reaction, thereby stacking the metal film in the depression sequentially, starting at a bottom of the depression, to form the multilayer interconnection structure integrally.

Thus, the effects described in 38) can be rendered further remarkable, because the metal film is stacked and buried at a time in the depressions continued to each other that are formed in the multilayer substrate, whereby the desired interconnection structure can be formed. Also, as the number of the layers increases in the conventional multilayer structure, the number of the CMP step also increases. With the present invention, by contrast, these steps can all be eliminated.

40) The multilayer interconnection structure forming method described in 39) may further comprise forming a barrier metal layer on a surface of the depression of the substrate prior to formation of the metal film with electrical conductivity.

Thus, in addition to the effects of the feature described in 39), the multilayer interconnection structure can be formed as an integrally continued single crystal-like crystal of the metal, and the barrier metal layer necessarily formed between the interconnection structures of the respective layers in the earlier technologies can be removed. Consequently, the metals forming the interconnection structures of the respective layers are not divided by the barrier metal layer, and a rise in resistivity at this site can be eliminated. Thus, the electrical characteristics of the interconnection structure can be improved accordingly. Moreover, the barrier metal layer, which was formed for each of the layers in the earlier technologies, can be formed at a time. In this respect as well, the multilayer interconnection structure can provide the overall decrease in the working steps.

41) In the interconnection structure forming method described in any one of 38) to 40), the metal film may be formed by a metal film production apparatus, which disposes an etched member, formed from a metal forming a high vapor pressure halide, in a chamber accommodating the substrate in an interior thereof; etches the etched member with a source gas plasma containing a halogen within the chamber to form the precursor comprising the metallic component and the source gas; and controls the temperatures of the etched member and the substrate so as to be predetermined temperatures and so as to provide a predetermined temperature difference between the temperatures, thereby depositing the metallic component of the precursor on the substrate to perform predetermined film formation.

Thus, the interconnection structure described in 34) to 37) can be formed satisfactorily by controlling the amount of the source gas plasma within the chamber.

The interconnection structure forming apparatus according to the present invention, based on the aforementioned findings, is characterized by the following feature:

42) An interconnection structure forming apparatus for forming a predetermined interconnection structure in a depression, such as a trench or a hole, formed in a substrate, by disposing an etched member, formed from a metal forming a high vapor pressure halide, in a chamber accommodating the substrate in an interior thereof; etching the etched member with a source gas plasma containing a halogen within the chamber to form a precursor comprising a metallic component and a source gas; and controlling the temperatures of the etched member and the substrate so as to be predetermined temperatures and so as to provide a predetermined temperature difference between the temperatures, thereby depositing the metallic component of the precursor on the substrate to perform film formation, the apparatus permitting the coexistence of a film formation reaction for forming the film of the metal, and an etching reaction for etching the metal film, formed by the film formation reaction, with a plasma of the source gas; and having control means for exercising control such that the speed of the film formation reaction is higher than the speed of the etching reaction, thereby stacking the metal film in the depression sequentially, starting at a bottom of the depression, to form the predetermined interconnection structure.

Thus, the interconnection structure described in 34) to 37) can be formed satisfactorily by controlling the amount of the source gas plasma within the chamber.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Preferred embodiments of the present invention will now be described in detail with reference to the accompanying drawings, which in no way limit the invention.

First Embodiment

Figure 1:
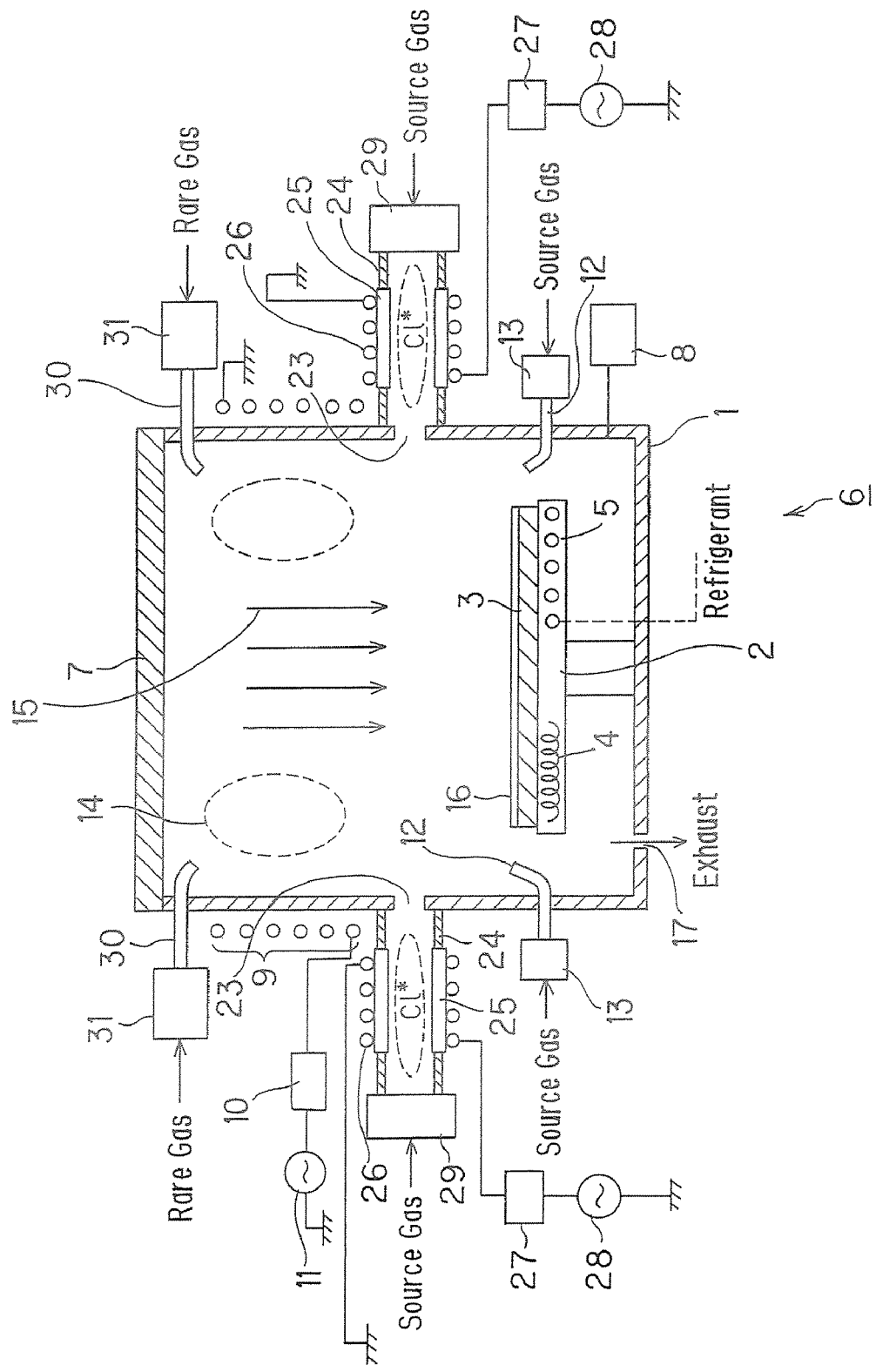
FIG. 1 is a schematic side view of a metal film production apparatus according to a first embodiment of the present invention.

FIG. 1 is a schematic side view of a metal film production apparatus according to a first embodiment of the present invention. As shown in FIG. 1, a support platform 2 is provided near the bottom of a cylindrical chamber 1 made of, say, a ceramic (an insulating material), and a substrate 3 is placed on the support platform 2. Temperature control means 6 equipped with a heater 4 and refrigerant flow-through means 5 is provided in the support platform 2 so that the support platform 2 is controlled to a predetermined temperature (for example, a temperature at which the substrate 3 is maintained at 100 to 200° C.) by the temperature control means 6.

An upper surface of the chamber 1 is an opening, which is closed with a copper plate member 7, as an etched member made of a metal. The interior of the chamber 1 closed with the copper plate member 7 is maintained at a predetermined pressure by a vacuum device 8.

A coiled film forming plasma antenna 9 is disposed around a cylindrical portion of the chamber 1 beside the copper plate member 7 in such a manner as to be wound in the axial direction of the chamber 1. A matching instrument 10 and a power source 11 are connected to the film forming plasma antenna 9 to supply power. Film forming plasma generation means is constituted by the film forming plasma antenna 9, matching instrument 10 and power source 11.

Slit-shaped opening portions 23 are formed at positions obliquely upward of the substrate 3 in the cylindrical portion of the chamber 1, and one end of a tubular passage 24 is fixed to each of the opening portions 23. A tubular excitation chamber 25 made of an insulator is provided halfway through the passage 24, and a coiled plasma antenna 26 is wound round the excitation chamber 25. The plasma antenna 26 is connected to a matching instrument 27 and a power source 28 to receive power. The opening portion 23, and the associated passage 24 and excitation chamber 25 are at the same height position of the chamber 1, and a combination of these members is disposed at each of four locations (only two locations are shown in the drawing) around the chamber 1. A flow controller 29 is connected to the other end of the passage 24, and a $Cl_2$ gas for obtaining Cl* is supplied into the passage 24 via the flow controller 29. The plasma antenna 26, matching instrument 27, power source 28 and flow controller 29 constitute source gas radical supply means.

In the source gas radical supply means, Cl* is formed by shooting electromagnetic waves from the plasma antenna 26 into the excitation chamber 25, while supplying a $Cl_2$ gas into the excitation chamber 25 via the flow controller 29. On this occasion, plasma conditions are adjusted so that Cl* can be formed at a high density within the excitation chamber 25. The so formed Cl* is supplied into the chamber 1 through the passage 24 at the time of film formation. This Cl* dissociates a $Cl_2$ gas from CuCl(ad) adsorbed onto the substrate 3 to promote the film formation reaction. That is, the film formation reaction shown in the equation (1) is promoted.

Nozzles 12 for supplying a source gas (a $Cl_2$ gas diluted with He to a chlorine concentration of 50%, preferably about 10%), containing chlorine, to the interior of the chamber 1 are connected to the cylindrical portion of the chamber 1 above the support platform 2. The nozzle 12 is open toward the copper plate member 7, and the nozzle 12 is fed with the source gas via a flow controller 13. The source gas is conveyed from beside the substrate 3 toward the copper plate member 7 along the wall surface within the chamber at the time of film formation.

Nozzles 30 for supplying a rare gas, such as an Ar gas, into the chamber 1 are connected to an upper site of the cylindrical portion of the chamber 1. The rare gas, such as an Ar gas, has its flow rate controlled by a flow controller 31, and is adapted to increase the dissociation rate of the $Cl_2$ gas in the film formation reaction indicated by the equation (2), thereby promoting the film formation reaction. Thus, a rare gas having a mass equal to or larger than that of Ne, with the exception of the He gas contained as a diluent gas in the source gas, can be used as a gas for increasing the dissociation rate of the $Cl_2$ gas to promote the film formation reaction. However, in consideration of the function of the rare gas, so to speak, as a catalyst for increasing the dissociation rate, an Ar gas or a Kr gas is preferred, and an Ar gas is optimal in terms of the cost.

A mode of film formation in the foregoing metal film production apparatus is as described below. For film formation, the film forming plasma antenna 9, and the plasma antenna 26 are energized.

While the source gas is supplied through the nozzles 12 into the chamber 1, electromagnetic waves are shot from the film forming plasma antenna 9 into the chamber 1, whereby the $Cl_2$ gas is ionized to generate a $Cl_2$ gas plasma (source gas plasma) 14. The $Cl_2$ gas plasma 14 is formed in spaces adjacent to the film forming plasma antenna 9 in the interior of the chamber 1, namely, in spaces beside the copper plate member 7 (upper portion) within the chamber 1.

The $Cl_2$ gas plasma 14 causes an etching reaction to the copper plate member 7, forming a precursor ($Cu_xCl_y$) 15. At this time, the copper plate member 7 is maintained by the $Cl_2$ gas plasma 14 at a predetermined temperature (e.g., 200 to 400° C.) which is higher than the temperature of the substrate 3.

The precursor ($Cu.Cl_y$) 15 formed within the chamber 1 is transported to the substrate 3 controlled to a lower temperature than the temperature of the copper plate member 7. The precursor ($Cu_xCl_y$) 15 transported to and adsorbed onto the substrate 3 deposits Cu on the substrate 3 in accordance with the reactions of the aforementioned equations (1) and (2) representing the film formation reaction. As a result, a thin Cu film 16 is formed on the surface of the substrate 3.

At this time, Cl* is formed with a high efficiency in the excitation chamber 25, and supplied into the chamber 1 for replenishment to dissociate Cl in the equation (1), promoting the film formation reaction. On the other hand, the Ar gas is supplied into the chamber 1 through the nozzles 30 to dissociate the $Cl_2$ gas in the equation (2), promoting the film formation reaction.

Since the metal film production apparatus constructed as above uses the $Cl_2$ gas plasma (source gas plasma) 14, the reaction efficiency is markedly increased, and the speed of film formation is fast. Since the $Cl_2$ gas is used as the source gas, moreover, the cost can be markedly decreased. Furthermore, the substrate 3 is controlled to a lower temperature than the temperature of the copper plate member 7 by use of the temperature control means 6. Thus, the amounts of impurities, such as chlorine, remaining in the thin Cu film 16 can be decreased, so that a high quality thin Cu film 16 can be produced.

Second Embodiment

Figure 2:
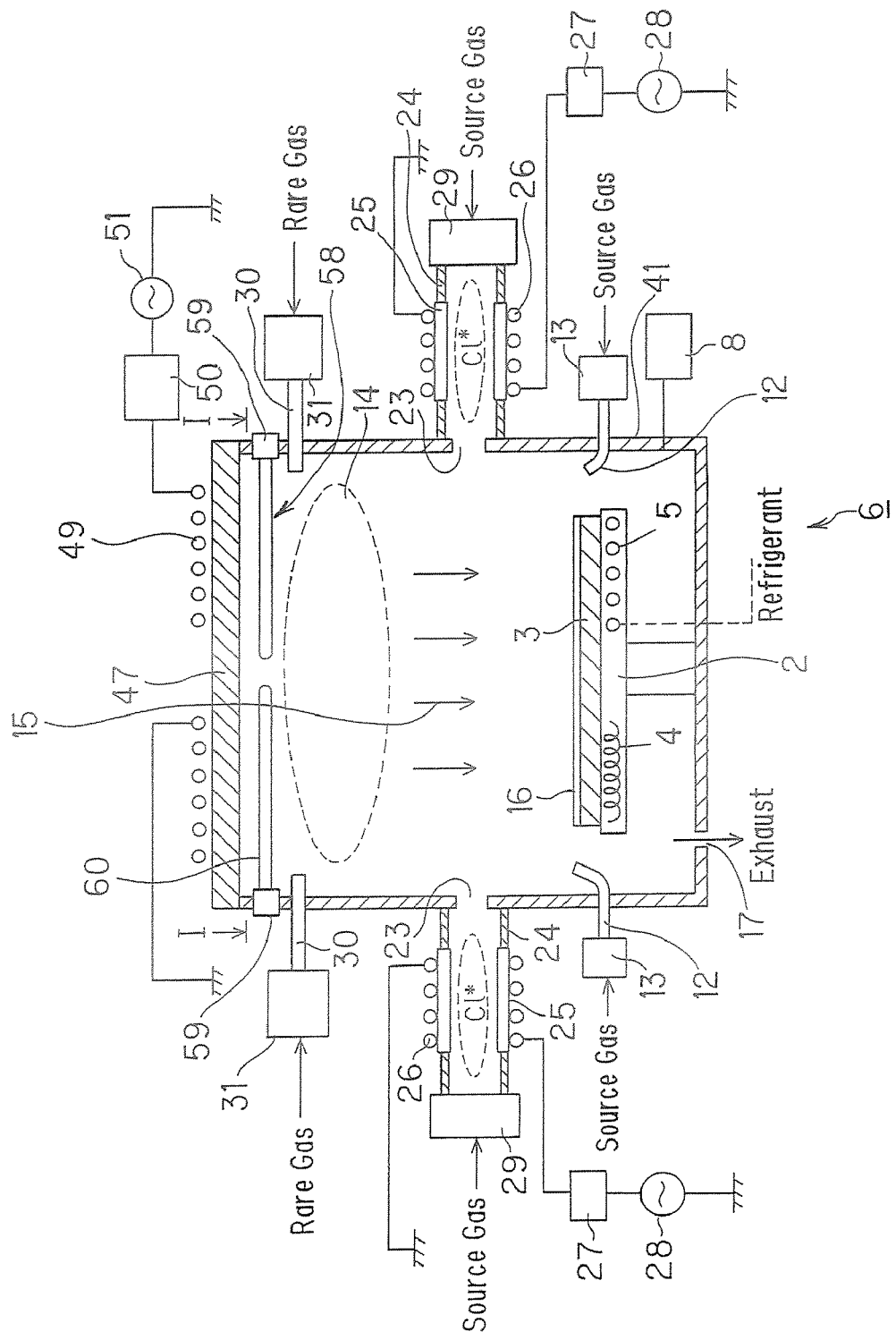
FIG. 2 is a schematic side view of a metal film production apparatus according to a second embodiment of the present invention.

FIG. 2 is a schematic side view of a metal film production apparatus according to a second embodiment of the present invention. As shown in FIG. 2, the metal film production apparatus according to the present embodiment is different in the construction of the plasma antenna and in the constructions of the associated portions, but is of the same construction in many portions, as compared with the first embodiment shown in FIG. 1. Thus, the same portions as in FIG. 1 are assigned the same numerals, and duplicate explanations are omitted.

As shown in FIG. 2, a chamber 41 is a cylindrical member made of a metal (for example, aluminum). An upper surface of the chamber 41 is an opening, which is closed with a disk-shaped ceiling board 47, an insulating member (for example, made of a ceramic). An etched member 58 made of copper, which comprises a ring portion 59 and protrusions 60, is disposed at a position opposed to a substrate 3 within the chamber 41, and is provided so as to be divided by the protrusions 60 into a plurality of portions in the circumferential direction. The protrusions 60, the respective divisional portions, protrude from the inner peripheral surface of the chamber 41 toward the center of the chamber 41. Details of the etched member 58 will be described later on based on FIG. 3. A film forming plasma antenna 49 is in a spiral form and is disposed outwardly of the ceiling board 47. The plasma antenna 49 receives an electric current supplied from a power source 51 via a matching instrument 50 to form an electric field. By the action of the electric field, a $Cl_2$ gas, a source gas supplied into the chamber 41, is converted into a plasma in a space beside the etched member 58 (upper portion) within the chamber 41 to form a $Cl_2$ gas plasma 14. That is, the film forming plasma antenna 49, matching instrument 50 and power source 51 constitute film forming plasma generation means.

Figure 3:
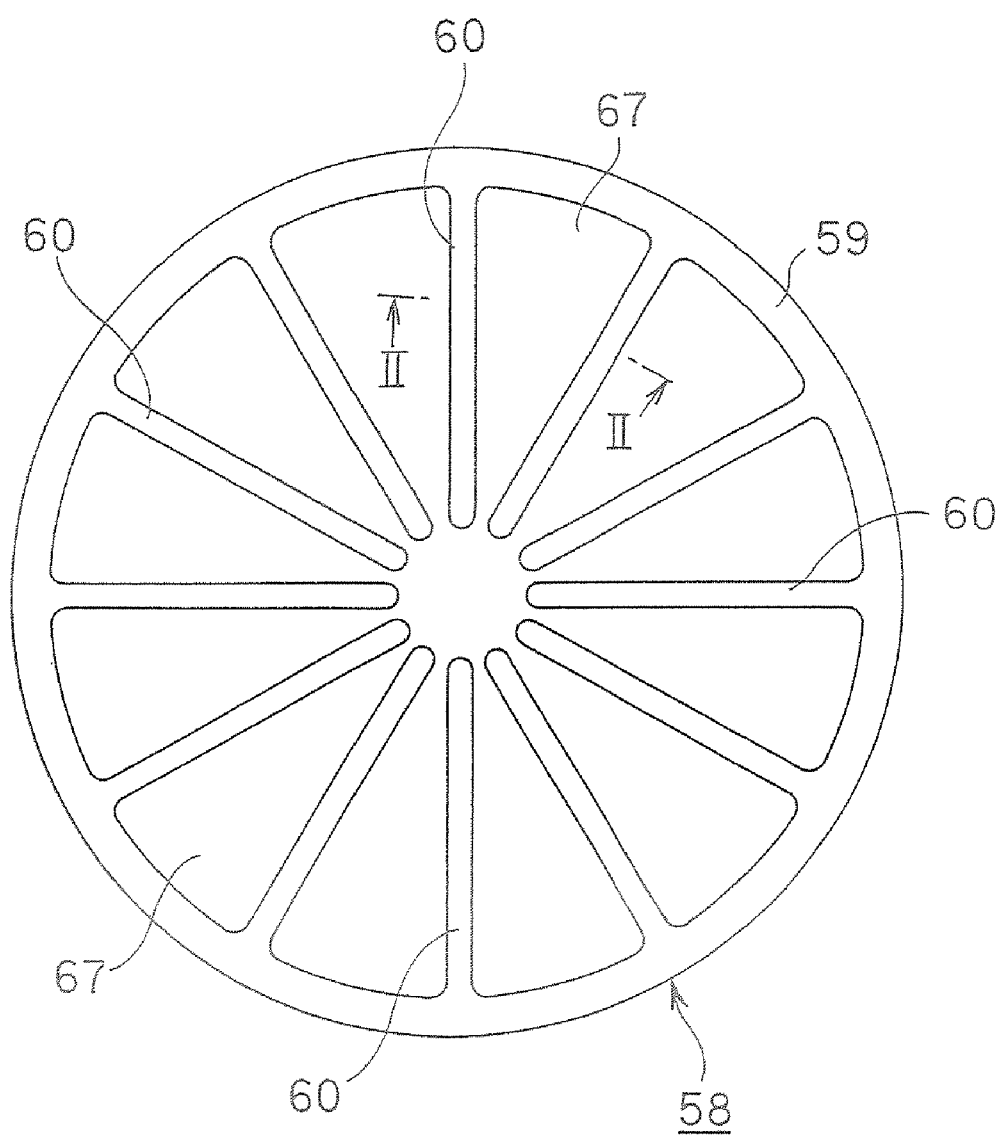
FIG. 3 is a view taken along the arrowed line I-I of FIG. 2.

As illustrated in detail in FIG. 3, a plurality of (12 in the illustrated embodiment) the protrusions 60, which extend close to the center in the diametrical direction of the chamber 41 (see FIG. 2) and have the same width, are provided in the circumferential direction on the inner periphery of the ring portion 59 of the etched member 58. The protrusions 60 are integrally or removably attached to the ring portion 59. Notches (spaces) 67 formed between the protrusions 60 are present between the ceiling board 47 (see FIG. 2) and the interior of the chamber 41. The ring portion 59 is earthed, and the plural protrusions 60 are electrically connected together by the ring portion 59, and maintained at the same potential.

At the time of film formation in the above-described metal film production apparatus, the film forming plasma antenna 49 and the plasma antenna 26 are energized. As a result, electromagnetic waves are shot from the film forming plasma antenna 49 into the chamber 41. Consequently, the $Cl_2$ gas is ionized to generate a $Cl_2$ gas plasma (source gas plasma) 14, so that a thin Cu film 16 is formed in the same mode as in the aforementioned first embodiment.

Figure 4:
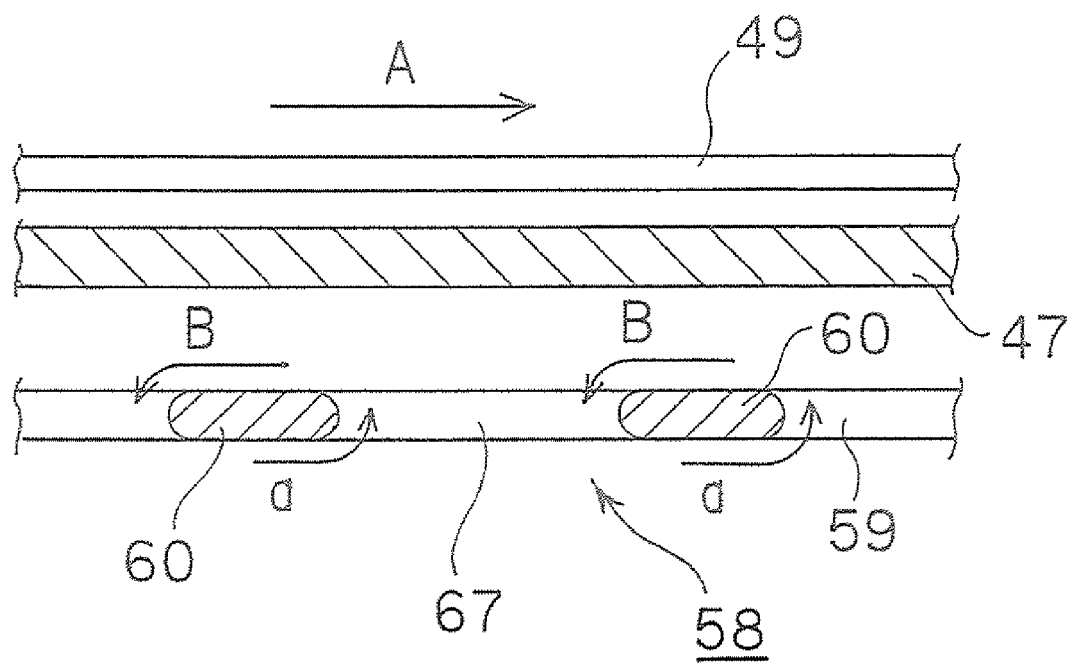
FIG. 4 is a view taken, along the arrowed line II-II of FIG. 3.

However, the mode of formation of a film forming plasma in the present embodiment is slightly different from that in the metal film production apparatus shown in FIG. 1. This mode will be explained based on FIG. 4. As shown in FIG. 4, when the $Cl_2$ gas plasma 14 (see FIG. 2) is generated below the etched member 58, the direction A of an electric current in the film forming plasma antenna 49 crosses the protrusions 60. As a result, an induced current B flowing in the direction shown in FIG. 4 occurs on the surface of the protrusion 60 opposed to the film forming plasma antenna 49. Since the notches (spaces) 67 are present in the etched member 58, the induced current B flows on the lower surface of each protrusion 60 in the same direction a as the direction A of the electric current in the film forming plasma antenna 49. When the etched member 58 is viewed from the substrate 3, therefore, there is no electric current in a direction in which the electric current in the film forming plasma antenna 49 is effectively canceled out, even when the protrusions 60, electric conductors, are present below the film forming plasma antenna 49, i.e., on the side of the substrate 3. Thus, an alternating electric field by the film forming plasma antenna 49 can be formed below the protrusions 60. Furthermore, the ring portion 59 is earthed, and the protrusions 60 are maintained at the same potential. Thus, even though the etched member 58, an electric conductor, exists, electromagnetic waves are reliably thrown from the film forming plasma antenna 49 into the chamber 1. Consequently, the $Cl_2$ gas plasma 14 can be stably generated below the etched member 58.

In the present embodiment as well, Cl* is formed with a high efficiency in the excitation chamber 25, and supplied into the chamber 41 for replenishment to dissociate Cl in the equation (1), promoting the film formation reaction. On the other hand, the Ar gas is supplied into the chamber 41 through the nozzles 30 to dissociate the $Cl_2$ gas in the equation (2), promoting the film formation reaction.

In the present embodiment, it is also possible to eliminate instability of the plasma due to a difference in potential by controlling the supply of the source gas, without connecting the protrusions 60 to the ring portion 59.

Third Embodiment

Figure 5:
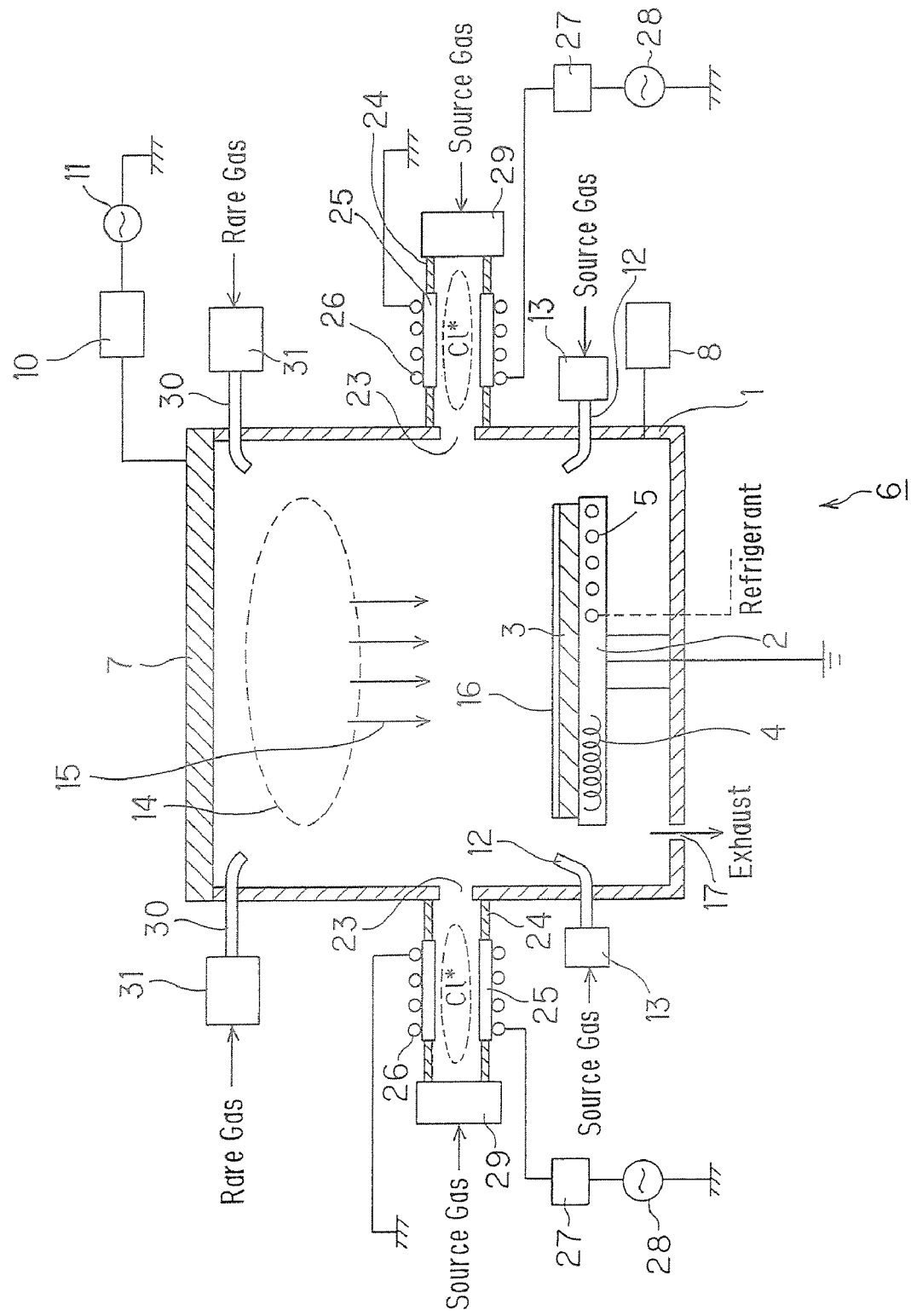
FIG. 5 is a schematic side view of a metal film production apparatus according to a third embodiment of the present invention.

As shown in FIG. 5, the present embodiment is an embodiment in which the film forming plasma antenna 9 in the first embodiment of FIG. 1 has been removed, and instead the copper plate member 7, the etched member, concurrently performs the function of a film forming plasma antenna. Thus, a high frequency power from the power source 11 is supplied to the copper plate member 7 via the matching instrument 10, and the support platform 2, an electrically conductive member, is grounded. That is, the copper plate member 7 and the support platform 2 serve as both electrodes to generate a $Cl_2$ gas plasma 14 therebetween within the chamber 1.

The other constructions in the metal film production apparatus according to the present embodiment are the same as in FIG. 1. Thus, the same portions are assigned the same numerals, and duplicate explanations are omitted.

In the present embodiment, while the source gas is supplied through the nozzles 12 into the chamber 1, electromagnetic waves are shot from the copper plate member 7 into the chamber 1, whereby the $Cl_2$ gas is ionized to generate a $Cl_2$ gas plasma (source gas plasma) 14. The $Cl_2$ gas plasma 14 causes an etching reaction to the copper plate member 7, forming a precursor ($C_{ux}Cl_y$) 15. At this time, the copper plate member 7 is maintained by temperature control means 6 at a predetermined temperature (e.g., 200 to 400° C.) which is higher than the temperature of the substrate 3. Thus, a thin Cu film 16 is formed on the surface of the substrate 3 in exactly the same mode as in the first embodiment.

In the present embodiment as well, Cl* is formed with a high efficiency in the excitation chamber 25, and supplied for replenishment into the chamber 1 to dissociate Cl in the equation (1), promoting the film formation reaction. On the other hand, the Ar gas is supplied into the chamber 1 through the nozzles 30 to dissociate the $Cl_2$ gas in the equation (2), promoting the film formation reaction.

Fourth Embodiment

Figure 6:
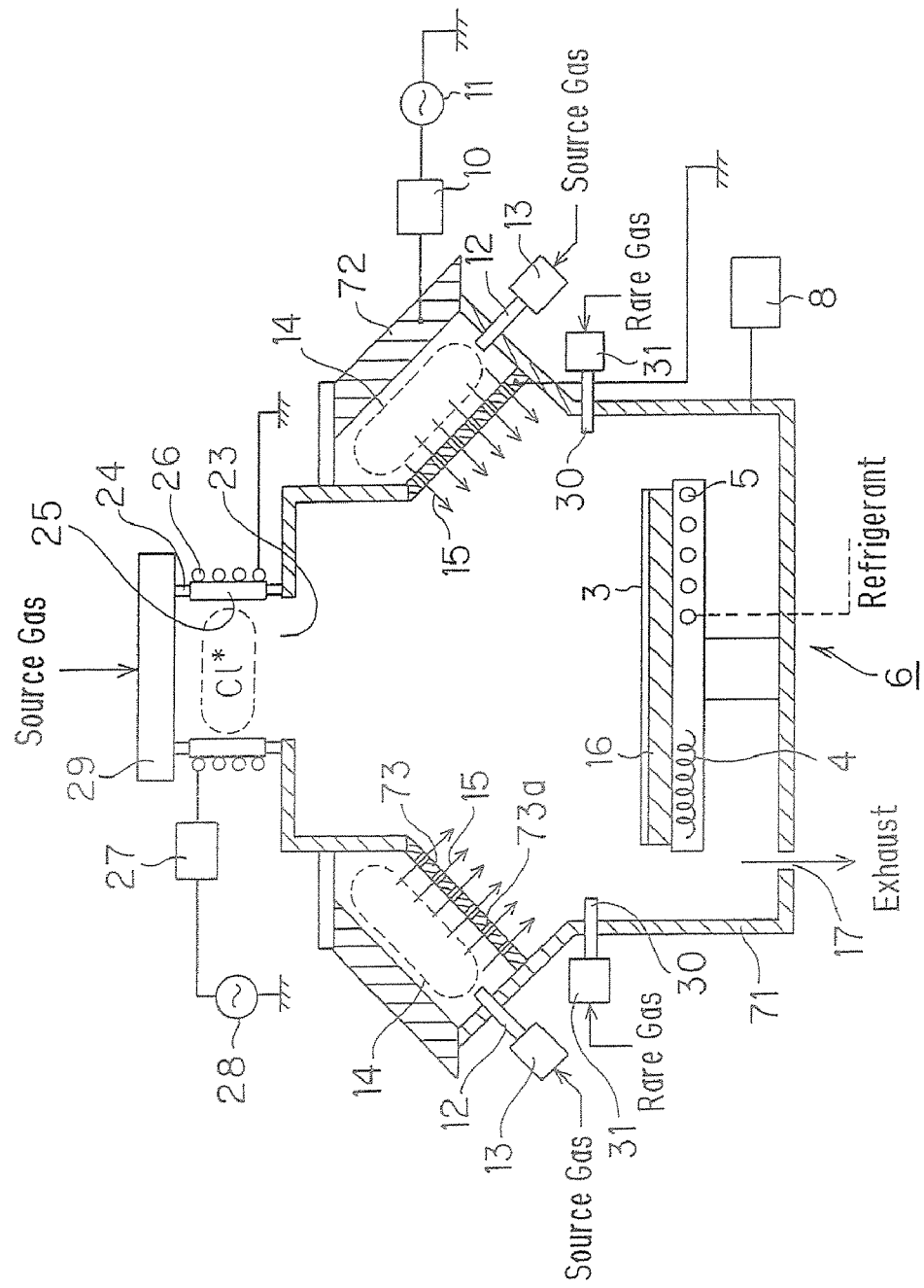
FIG. 6 is a schematic side view of a metal film production apparatus according to a fourth embodiment of the present invention.

As shown in FIG. 6, the present embodiment can be positioned as a modification of the third embodiment shown in FIG. 5. In this modified embodiment, a copper plate member 72, an etched member, is disposed at a position which is not a position opposed to the substrate 3 within a chamber 71. At the same time, a shielding plate 73 of a ground potential, which serve as a counter electrode, is disposed. A high frequency power from the power source 11 is supplied to the copper plate member 72 via the matching instrument 10. Also, a source gas is supplied between the copper plate member 72 and the shielding plate 73 within the chamber 71 through the nozzles 12. Thus, a plasma of the source gas is generated. Many holes 73a are formed in the shielding plate 73, and a precursor 15 formed between the copper plate member 72 and the shielding plate 73 passes through the holes 73a, arriving at a space above the substrate 3 within the chamber 71. The copper plate member 72 is a hollow member in the shape of a truncated cone, and the shielding plate 73 is composed of a hollow, truncated conical member similar in shape to the copper plate member 72. Thus, the surfaces of the copper plate member 72 and the shielding plate 73 opposed to each other are parallel, and inclined to the substrate 3. Because of this arrangement, particles peeled from the etched copper plate member 72 and falling are prevented from adhering onto the substrate 3, and the predetermined precursor 15 can be supplied to the space above the substrate 3. This is because the particles are blocked by the shielding plate 73 and have a low possibility to arrive at the space above the substrate 3, while the precursor 15 can easily pass through the holes 73a.

The other constructions in the metal film production apparatus according to the present embodiment are the same as in FIG. 5. Thus, the same portions are assigned the same numerals, and duplicate explanations are omitted.

In the present embodiment, while the source gas is supplied through the nozzles 12 into the chamber 71, electromagnetic waves are shot from the copper plate member 72 into the chamber 71, whereby the $Cl_2$ gas is ionized to generate a $Cl_2$ gas plasma (source gas plasma) 14. The $Cl_2$ gas plasma 14 causes an etching reaction to the copper plate member 72, forming a precursor ($C_{ux}Cl_y$) 15. The precursor ($Cu_xCl_y$) 15 arrives at the space above the substrate 3 within the chamber 71 through the holes 73a of the shielding plate 73. At this time, the copper plate member 72 is maintained by temperature control means 6 at a temperature (e.g., 200 to 400° C.) which is higher than the temperature of the substrate 3. Thus, a thin Cu film 16 is formed on the surface of the substrate 3 in exactly the same mode as in the first embodiment.

The precursor ($C_{ux}Cl_y$) 15 easily passes through the holes 73a, but only a tiny portion of Cl* formed between the copper plate member 72 and the shielding plate 73 can pass through the holes 73a and arrive at the space above the substrate 3. The reason is that Cl* colliding with the shielding plate 73 combines with another Cl* colliding with the shielding plate 73 to become a $Cl_2$ gas. That is, a reaction expressed by Cl*+Cl*→$Cl_2$ occurs, so that Cl* vanishes.

In the present embodiment as well, Cl* is formed with a high efficiency in the excitation chamber 25, and supplied for replenishment into the chamber 71 to dissociate Cl in the equation (1), promoting the film formation reaction. In the present embodiment, most of Cl* formed in the space between the copper plate member 72 and the shielding plate 73 vanishes, as stated above. In this embodiment at such a disadvantage, the supply of Cl* for replenishment is more meaningful, and its contribution to the promotion of the film formation reaction is particularly remarkable.

In the present embodiment as well, the Ar gas is supplied into the chamber 71 through the nozzles 30 to dissociate the $Cl_2$ gas in the equation (2), promoting the film formation reaction.

Fifth Embodiment

Figure 7:
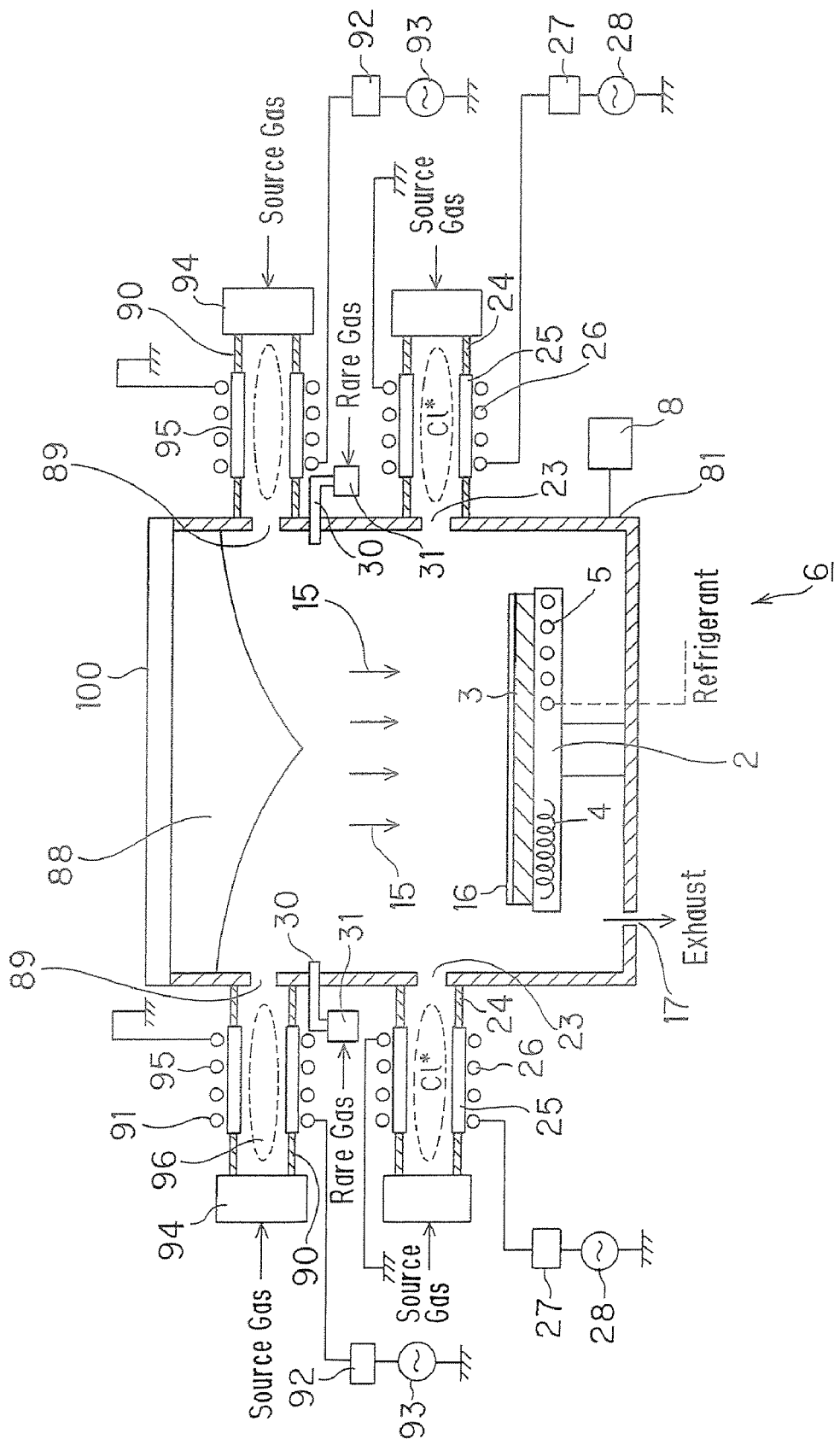
FIG. 7 is a schematic side view of a metal film production apparatus according to a fifth embodiment of the present invention.

In the respective embodiments, the source gas is supplied into the chamber 1 or the like, and converted into a plasma. However, a source gas plasma may be directly supplied into the chamber. A metal film production apparatus having such a feature will be described in detail with reference to FIG. 7. As shown in FIG. 7, the metal film production apparatus according to the present embodiment is greatly different from the metal film production apparatus according to the first embodiment, etc. shown in FIG. 1, etc. in that it does not have the film forming plasma antenna 9, etc. However, the metal film production apparatus according to the present embodiment has many constituent elements in common with the metal film production apparatus according to the first embodiment, etc. Thus, the same portions as in FIG. 1, etc. are assigned the same numerals, and duplicate explanations are omitted.

As shown in FIG. 7, an upper surface of a cylindrical chamber 81 made of, for example, a ceramic (an insulating material) is an opening, and the opening is closed with a ceiling board 100, for example, made of a ceramic (an insulating material). An etched member 88 made of a metal (copper, Cu) is provided on a lower surface of the ceiling board 100, and the etched member 88 is of a pyramidal shape. Slit-shaped opening portions 89 are formed at four locations (only two locations are shown in the drawing) in the periphery of an upper part of the cylindrical portion of the chamber 81, and one end of a tubular passage 90 is fixed to each of the opening portions 89. A tubular excitation chamber 95 made of an insulator is provided halfway through the passage 90, and a coiled plasma antenna 91 is provided around the excitation chamber 95. The plasma antenna 91 is connected to a matching instrument 92 and a power source 93 to receive power. The plasma antenna 91, the matching instrument 92 and the power source 93 constitute plasma generation means.

A flow controller 94 is connected to the other end of the passage 90, and a source gas containing chlorine as a halogen (a $Cl_2$ gas diluted with He to a chlorine concentration of ≦50%, preferably about 10%) is supplied into the passage 90 via the flow controller 94. By shooting electromagnetic waves from the plasma antenna 91 into the excitation chamber 95, the $Cl_2$ gas is ionized to generate a $Cl_2$ gas plasma (source gas plasma) 96. This means the construction of excitation means by which the source gas containing chlorine is excited in the excitation chamber 95 isolated from the chamber 81. Because of the generation of the $Cl_2$ gas plasma 96, excited chlorine is fed toward the etched member 88 (upper portion) within the chamber 81 through the opening portions 89, whereupon the etched member 88 is etched with excited chlorine.

At the time of film formation in the above-described metal film production apparatus, the $Cl_2$ gas plasma 96 is generated in the excitation chamber 95, and the $Cl_2$ gas plasma 96 is introduced through the opening portions 89 into the chamber 81 in which the temperature conditions for the etched member 88 and the substrate 3 have been adjusted as predetermined. Thus, the etched member 88 is etched in the same manner as for the metal film production apparatus shown in FIG. 1, etc., whereby a thin Cu film 16 can be formed on the substrate 3.

In the present embodiment as well, Cl* is formed with a high efficiency in the excitation chamber 25, and supplied for replenishment into the chamber 81 to dissociate Cl in the equation (1), promoting the film formation reaction. On the other hand, the Ar gas is supplied into the chamber 81 through the nozzles 30 to dissociate the $Cl_2$ gas in the equation (2), promoting the film formation reaction.

Next, an explanation will be offered for a case in which the etched member is made of a composite metal comprising, for example, In and Cu, or a composite metal such as $CuInSe_2$, CdS, or ZnSe, and a thin film of the composite metal is produced.

Not only in the above-described production of the thin Cu film, but also in the production of a thin film of the composite metal (e.g., a thin InCu film), the following reactions are assumed to occur:

Dissociation reaction of plasma: $Cl_2 \rightarrow 2Cl^*$

Etching reaction: $Cu+Cl^* \rightarrow CuCl(g)$ $In+Cl^* \rightarrow InCl(g)$

Adsorption to substrate: $CuCl(g) \rightarrow CuCl(ad)$ $InCl(g) \rightarrow InCl(ad)$ Film Formation Reaction:

$$CuCl(ad)+Cl^* \rightarrow Cu+Cl_2\downarrow \quad (3)$$

$$InCl(ad)+Cl^* \rightarrow In+Cl_2\downarrow \quad (4)$$

Here, Cl* represents radicals of Cl, (g) represents a gaseous state, and (ad) represents an adsorbed state.

Another film formation reaction as indicated below is expected to be similarly taking place in correspondence with the equation (2) predicted for the production of the thin Cu film:

$$2CuCl(ad) \rightarrow 2Cu+Cl_2 \quad (5)$$

$$2InCl(ad) \rightarrow 2In+Cl_2 \quad (6)$$

Besides, in the case of the composite metal, such as CuInSe2, CdS, or ZnSe, which contains a nonmetallic element, the nonmetallic element in the composite metal is assumed to be chlorinated with Cl*. That is, upon etching with Cl*, the nonmetallic element, such as Se or S, forms a chloride and becomes a precursor. The precursor is transported onto the substrate to turn into a constituent element of the thin film.

Sixth Embodiment

Figure 8:
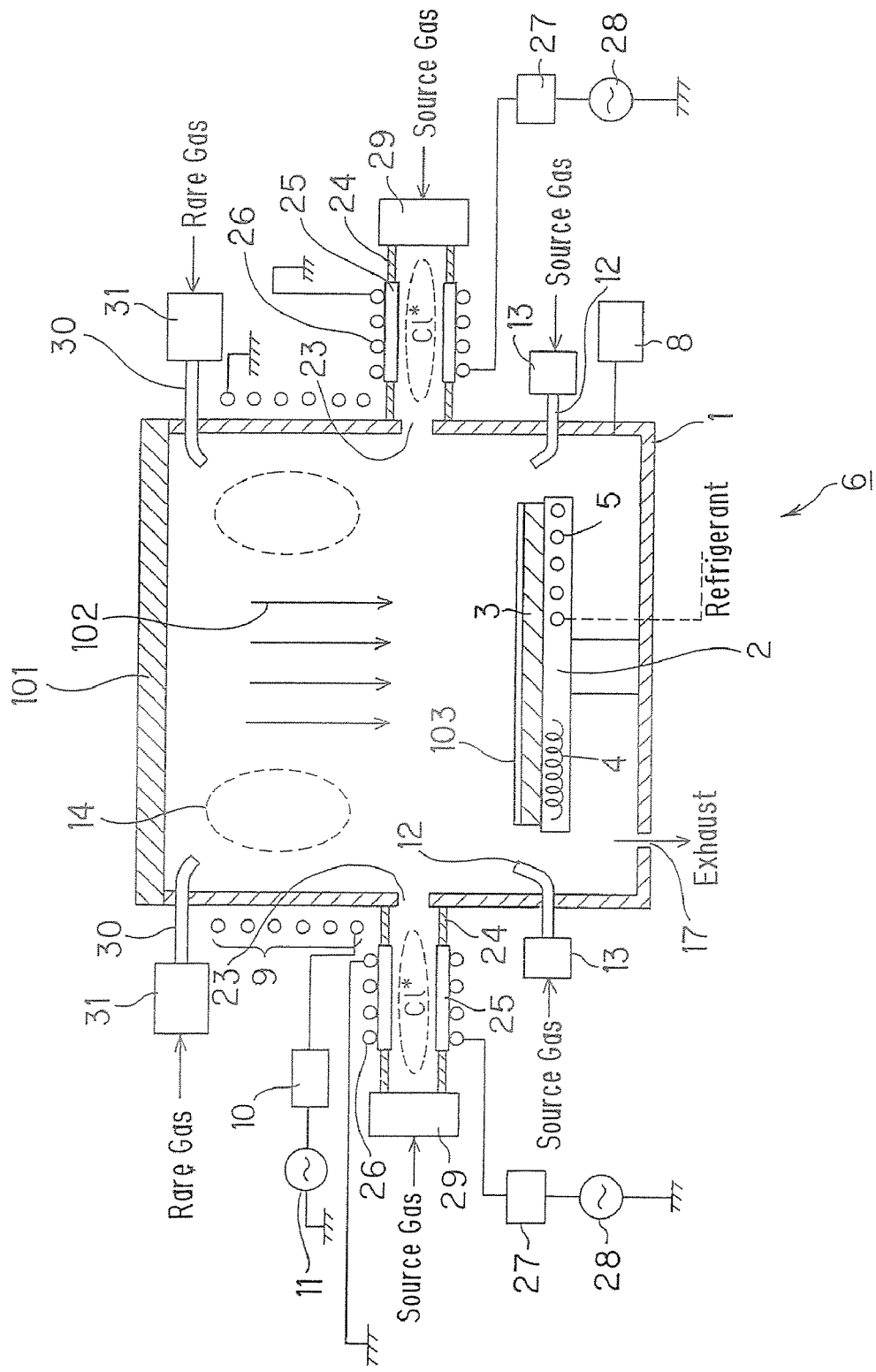
FIG. 8 is a schematic side view of a metal film production apparatus according to a sixth embodiment of the present invention.

FIG. 8 is a schematic side view of a metal film production apparatus according to a sixth embodiment of the present invention. As shown in FIG. 8, a support platform 2 is provided near the bottom of a cylindrical chamber 1 made of, say, a ceramic (an insulating material), and a substrate 3 is placed on the support platform 2. Temperature control means 6 equipped with a heater 4 and refrigerant flow-through means 5 is provided in the support platform 2 so that the support platform 2 is controlled to a predetermined temperature (for example, a temperature at which the substrate 3 is maintained at 100 to 200° C.) by the temperature control means 6.

An upper surface of the chamber 1 is an opening, which is closed with a composite metal plate member 101, as an etched member, made of a composite metal consisting of In and Cu. The composite metal plate member 101 is prepared by mixing In and Cu uniformly at a ratio of 1:1, and then press molding the mixture into a plate. According to this method of preparation, the composite metal plate member 101 can be easily produced. Alternatively, the composite metal plate member 101 may be formed as a split type in which its right half is formed from In, and its left half is formed from Cu. According to this method of preparation, it is easy to control the composition of the thin film formed. The interior of the chamber 1 closed with the composite metal plate member 101 is maintained at a predetermined pressure by a vacuum device 8.

A coiled film forming plasma antenna 9 is disposed around a cylindrical portion of the chamber 1 beside the composite metal plate member 101 in such a manner as to be wound in the axial direction of the chamber 1. A matching instrument 10 and a power source 11 are connected to the film forming plasma antenna 9 to supply power. Film forming plasma generation means is constituted by the film forming plasma antenna 9, matching instrument 10 and power source 11.

Slit-shaped opening portions 23 are formed at positions obliquely upward of the substrate 3 in the cylindrical portion of the chamber 1, and one end of a tubular passage 24 is fixed to each of the opening portions 23. A tubular excitation chamber 25 made of an insulator is provided halfway through the passage 24, and a coiled plasma antenna 26 is wound round the excitation chamber 25. The plasma antenna 26 is connected to a matching instrument 27 and a power source 28 to receive power. The opening portion 23, and the associated passage 24 and excitation chamber 25 are at the same height position of the chamber 1, and a combination of these members is disposed at each of four locations (only two locations are shown in the drawing) around the chamber 1. A flow controller 29 is connected to the other end of the passage 24, and a $Cl_2$ gas for obtaining Cl* is supplied into the passage 24 via the flow controller 29. The plasma antenna 26, matching instrument 27, power source 28 and flow controller 29 constitute source gas radical supply means.

In the source gas radical supply means, Cl* is formed by shooting electromagnetic waves from the plasma antenna 26 into the excitation chamber 25, while supplying a $Cl_2$ gas into the excitation chamber 25 via the flow controller 29. On this occasion, plasma conditions are adjusted within the excitation chamber 25 so that Cl* can be formed at a high density within it. The so formed Cl* is supplied into the chamber 1 through the passage 24 at the time of film formation. This Cl* dissociates a $Cl_2$ gas from metal chlorides (CuCl, InCl) adsorbed onto the substrate 3 to promote the film formation reaction. That is, the film formation reaction shown in the equations (3) and (4) is promoted.

Nozzles 12 for supplying a source gas containing chlorine (a $Cl_2$ gas diluted with He to a chlorine concentration of S 50%, preferably about 10%) to the interior of the chamber 1 are connected to the cylindrical portion of the chamber 1 above the support platform 2. The nozzle 12 is open toward the composite metal plate member 101, and the nozzle 12 is fed with the source gas via a flow controller 13. The source gas is conveyed from beside the substrate 3 toward the composite metal plate member 101 along the wall surface within the chamber 1 at the time of film formation.

Nozzles 30 for supplying a rare gas, such as an Ar gas, into the chamber 1 are connected to an upper site of the cylindrical portion of the chamber 1. The rare gas, such as an Ar gas, has its flow rate controlled by a flow controller 31, and is adapted to increase the dissociation rate of the $Cl_2$ gas in the film formation reaction indicated by the equations (5) and (6), thereby promoting the film formation reaction. Thus, a rare gas having a mass equal to or larger than that of Ne, with the exception of the He gas contained as a diluent gas in the source gas, can be used as a gas for increasing the dissociation rate of the $Cl_2$ gas to promote the film formation reaction. However, in consideration of the function of the rare gas, so to speak, as a catalyst for increasing the dissociation rate, an Ar gas or a Kr gas is preferred, and an Ar gas is optimal in terms of the cost.

A mode of film formation in the foregoing metal film production apparatus is as described below. During film formation, the film forming plasma antenna 9, and the plasma antenna 26 are energized.

While the source gas is supplied from the nozzles 12 into the chamber 1, electromagnetic waves are shot from the film forming plasma antenna 9 into the chamber 1, whereby the $Cl_2$ gas is ionized to generate a $Cl_2$ gas plasma (source gas plasma) 14. The $Cl_2$ gas plasma 14 is formed in spaces adjacent to the film forming plasma antenna 9 in the interior of the chamber 1, namely, in spaces beside the composite metal plate member 101 (upper portion) within the chamber 1.

The $Cl_2$ gas plasma 14 causes an etching reaction to the composite metal plate member 101, forming a precursor 102. At this time, the composite metal plate member 101 is maintained by the $Cl_2$ gas plasma 14 at a predetermined temperature (e.g., 200 to 400° C.) which is higher than the temperature of the substrate 3. The precursor 102 consists of $Cu_{x1}Cl_{y1}$ and $In_{x2}Cl_{y2}$.

The precursor 102 formed within the chamber 1 is transported to the substrate 3 controlled to a lower temperature than the temperature of the composite metal plate member 101. The precursor 102 transported to and adsorbed onto the substrate 3 deposits Cu and In on the substrate 3 in accordance with the reactions of the aforementioned equations (3) to (6) representing the film formation reaction. As a result, a thin composite metal film 103 composed of Cu and In is formed on the surface of the substrate 3.

At this time, Cl* is formed with a high efficiency in the excitation chamber 25, and supplied for replenishment into the chamber 1 to dissociate Cl in the equations (3) and (4), promoting the film formation reaction. On the other hand, the Ar gas is supplied into the chamber 1 through the nozzles 30 to dissociate the $Cl_2$ gas in the equations (5) and (6), promoting the film formation reaction.

Since the metal film production apparatus constructed as above uses the $Cl_2$ gas plasma (source gas plasma) 14, the reaction efficiency is markedly increased, and the speed of film formation is fast. Since the $Cl_2$ gas is used as the source gas, moreover, the cost can be markedly decreased. Furthermore, the substrate 3 is controlled to a lower temperature than the temperature of the composite metal plate member 101 by use of the temperature control means 6. Thus, the amounts of impurities, such as chlorine, remaining in the thin composite metal film 103 can be decreased, so that a high quality thin composite metal film 103 can be produced.

With the metal film production apparatus according to the present embodiment, moreover, the composite metal plate member 101 may be produced from a composite metal such as CuInSe2, CdS or ZnSe. Thus, a thin film of any of these composite metals can be prepared.

Seventh Embodiment

Figure 9:
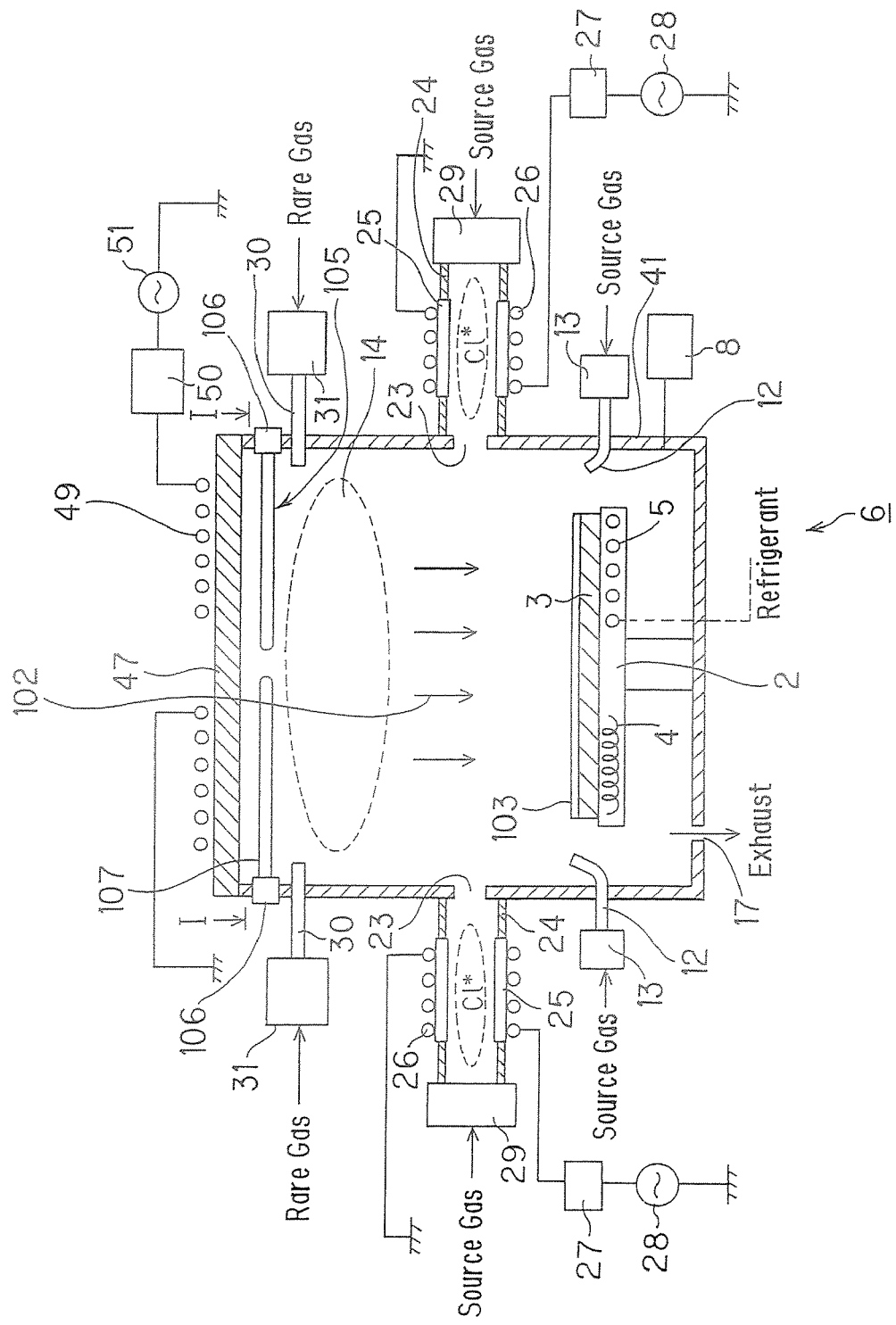
FIG. 9 is a schematic side view of a metal film production apparatus according to a seventh embodiment of the present invention.

FIG. 9 is a schematic side view of a metal film production apparatus according to a seventh embodiment of the present invention. As shown in FIG. 9, the metal film production apparatus according to the present embodiment is different in the construction of the plasma antenna and in the constructions of the associated portions, but is of the same construction in many portions, as compared with the sixth embodiment shown in FIG. 8. Thus, the same portions as in FIG. 8 are assigned the same numerals, and duplicate explanations are omitted.

As shown in FIG. 9, a chamber 41 is a cylindrical member made of a metal (for example, aluminum). An upper surface of the chamber 41 is an opening, which is closed with a disk-shaped ceiling board 47, an insulating member (for example, made of a ceramic). A composite metal member 105, which comprises a ring portion 106 and protrusions 107, is disposed at a position opposed to a substrate 3 within the chamber 41, and is provided so as to be divided by the protrusions 107 into a plurality of portions in the circumferential direction. The protrusions 107, the respective divisional portions, protrude from the inner peripheral surface of the chamber 41 toward the center of the chamber 41. Details of the composite metal member 105 will be described later on based on FIG. 10. A film forming plasma antenna 49 is in a spiral form and is disposed outwardly of the ceiling boards 47. The film forming plasma antenna 49 receives an electric current supplied from a power source 51 via a matching instrument 50 to form an electric field. By the action of the electric field, a $Cl_2$ gas, a source gas supplied into the chamber 41, is converted into a plasma in a space beside the composite metal member 105 (upper portion) within the chamber 41 to form a $Cl_2$ gas plasma 14. That is, the film forming plasma antenna 49, matching instrument 50 and power source 51 constitute film forming plasma generation means.

Figure 10:
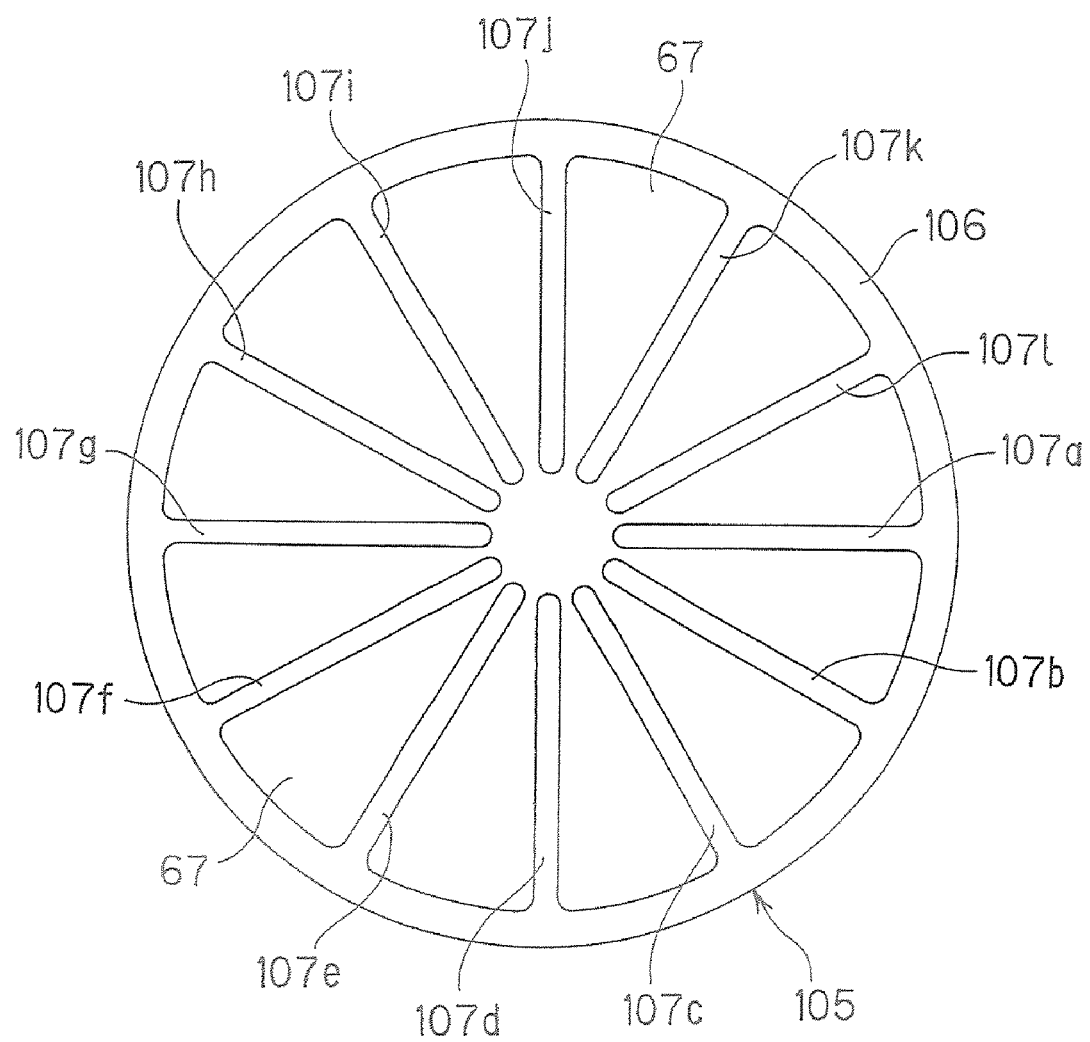
FIG. 10 is a view taken along the arrowed line I-I of FIG. 9.

As illustrated in detail in FIG. 10, a plurality of (12 in the illustrated embodiment) protrusions 107a to 107l, which extend close to the center in the diametrical direction of the chamber 41 (see FIG. 9) and have the same width, are provided in the circumferential direction on the inner periphery of the ring portion 106 of the composite metal member 105. The protrusions 107a to 107l are integrally or removably attached to the ring portion 106. The protrusions 107a, 107e and 107i are made of Cu (copper), the protrusions 107c, 107g and 107k are made of In (indium), and the protrusions 107b, 107d, 107f, 107h, 107j and 107l are made of Se (selenium). That is, the respective protrusions are formed in conformity with the proportions of the elements in the composition of $CuInSe_2$. Notches (spaces) 67 formed between the protrusions 107a to 107l are present between the ceiling board 47 (see FIG. 9) and the interior of the chamber 41. The ring portion 106 is earthed, and the plural protrusions 107a to 107l are electrically connected together by the ring portion 106, and maintained at the same potential.

At the time of film formation in the above-described metal film production apparatus, the film forming plasma antenna 49 and the plasma antenna 26 are energized. As a result, electromagnetic waves are shot from the film forming plasma antenna 49 into the chamber 41. Consequently, the $Cl_2$ gas is ionized to generate a $Cl_2$ gas plasma (source gas plasma) 14, so that a thin composite metal film 103 is formed in the same mode as in the aforementioned sixth embodiment.

The thin composite metal film 103 in the present embodiment is a thin film of a composite metal comprising $CuInSe_2$ containing a nonmetallic element, but is assumed to have been formed by the same mechanism of action as for the formation of the composite metal film consisting only of metallic elements that is shown in the aforementioned sixth embodiment. That is, not only the metallic elements Cu and In, but also the nonmetallic element Se may also be chlorinated with Cl* to form a chloride as a precursor. The precursor may be transported to the substrate, forming a thin film.

In the present embodiment as well, Cl* is formed with a high efficiency in the excitation chamber 25, and supplied for replenishment into the chamber 41 to dissociate Cl in the equations (3) and (4), promoting the film formation reaction. Moreover, the chlorinated Se adsorbed onto the substrate is also assumed to dissociate Cl, promoting the film formation reaction. On the other hand, the Ar gas is supplied into the chamber 41 through the nozzles 30 to dissociate the $Cl_2$ gas in the equations (5) and (6), promoting the film formation reaction.

With the metal film production apparatus according to the present embodiment, moreover, the composite metal member 105 may be produced from a composite metal such as CdS, ZnSe or InCu. Thus, a thin film of any of these composite metals can be prepared.

Eighth Embodiment

Figure 11:
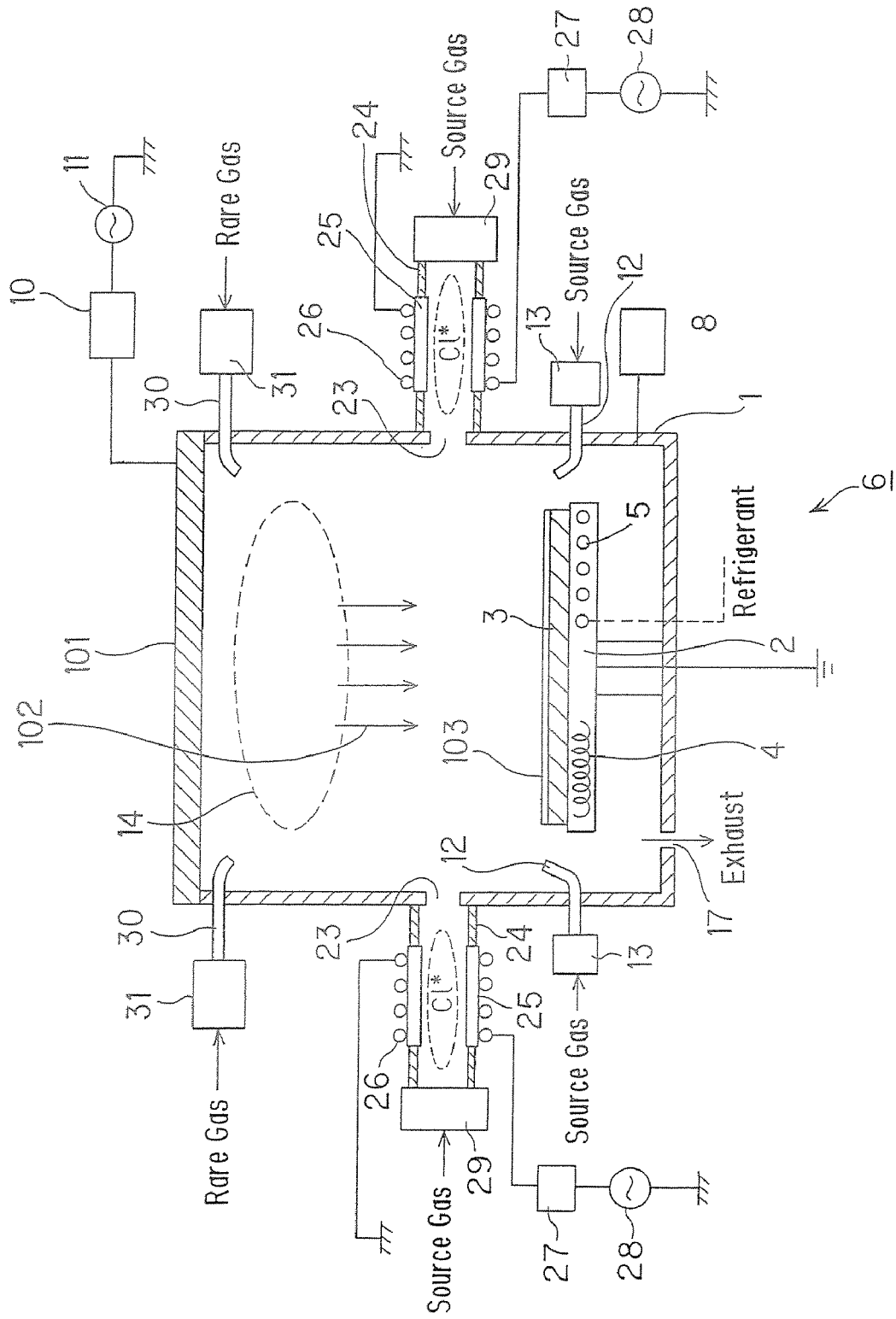
FIG. 11 is a schematic side view of a metal film production apparatus according to an eighth embodiment of the present invention.

As shown in FIG. 11, the present embodiment is an embodiment in which the film forming plasma antenna 9 in the sixth embodiment shown in FIG. 8 has been removed, and instead the composite metal plate member 101, the etched member, concurrently performs the function of a film forming plasma antenna. Thus, a high frequency power from the power source 11 is supplied to the composite metal plate member 101 via the matching instrument 10, and the support platform 2, an electrically conductive member, is grounded. That is, the composite metal plate member 101 and the support platform 2 serve as both electrodes to generate a $Cl_2$ gas plasma 14 therebetween within the chamber 1. The composite metal plate member 101 is formed from a composite metal consisting of In and Cu.

The other constructions in the metal film production apparatus according to the present embodiment are the same as in FIG. 8. Thus, the same portions are assigned the same numerals, and duplicate explanations are omitted.

In the present embodiment, while the source gas is supplied through the nozzles 12 into the chamber 1, electromagnetic waves are shot from the composite metal plate member 101 into the chamber 1, whereby the $Cl_2$ gas is ionized to generate a $Cl_2$ gas plasma (source gas plasma) 14. The $Cl_2$ gas plasma 14 causes an etching reaction to the composite metal plate member 101, forming a precursor 102. The precursor 102 comprises $Cu_{x1}Cl_{y1}$ and $In_{x2}Cl_{y2}$. At this time, the composite metal plate member 101 is maintained by temperature control means 6 at a temperature (e.g., 200 to 400° C.) which is higher than the temperature of the substrate 3. Thus, a thin composite metal film 103 comprising Cu and In is formed on the surface of the substrate 3 in exactly the same mode as in the sixth embodiment.

In the present embodiment as well, Cl* is formed with a high efficiency in the excitation chamber 25, and supplied for replenishment into the chamber 1 to dissociate Cl in the equations (3) and (4), promoting the film formation reaction. On the other hand, the Ar gas is supplied into the chamber 1 through the nozzles 30 to dissociate the $Cl_2$ gas in the equations (5) and (6), promoting the film formation reaction.

With the metal film production apparatus according to the present embodiment, moreover, the composite metal plate member 101 may be produced from a composite metal such as $CuInSe_2$, CdS or ZnSe. Thus, a thin film of any of these composite metals can be prepared.

Ninth Embodiment

Figure 12:
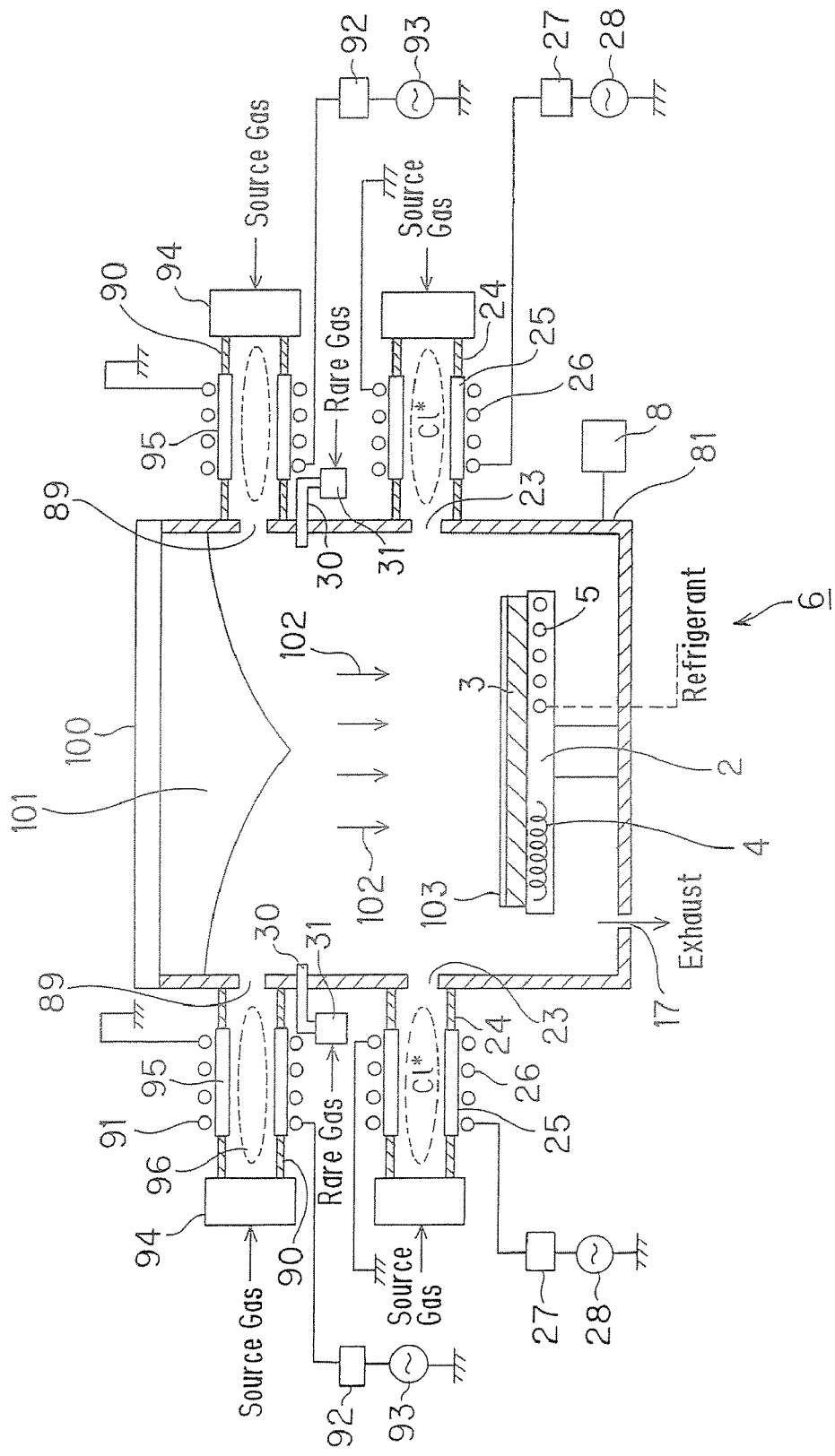
FIG. 12 is a schematic side view of a metal film production apparatus according to a ninth embodiment of the present invention.

In the above sixth to eighth embodiments, the source gas is supplied into the chamber 1 or the like, and converted into a plasma. However, a source gas plasma may be directly supplied into the chamber. A metal film production apparatus having such a feature will be described in detail with reference to FIG. 12. As shown in FIG. 12, the metal film production apparatus according to the present embodiment is greatly different from the metal film production apparatus according to the sixth embodiment, etc. shown in FIG. 8, etc. in that it does not have the film forming plasma antenna 9, etc. However, the metal film production apparatus according to the present embodiment has many constituent portions in common with the metal film production apparatus according to the sixth embodiment, etc. Thus, the same portions as in. FIG. 8, etc. are assigned the same numerals, and duplicate explanations are omitted.

As shown in FIG. 12, an upper surface of a cylindrical chamber 81 made of, for example, a ceramic (an insulating material) is an opening, and the opening is closed with a ceiling board 100, for example, made of a ceramic (an insulating material). A composite metal plate member 101 is provided on a lower surface of the ceiling board 100, and the composite metal plate member 101 is of a pyramidal shape. The composite metal plate member 101 is formed from a composite metal composed of In and Cu.

Slit-shaped opening portions 89 are formed at four locations (only two locations are shown in the drawing) in the periphery of an upper part of the cylindrical portion of the chamber 81, and one end of a tubular passage 90 is fixed to each of the opening portions 89. A tubular excitation chamber 95 made of an insulator is provided halfway through the passage 90, and a coiled plasma antenna 91 is provided around the excitation chamber 95. The plasma antenna 91 is connected to a matching instrument 92 and a power source 93 to receive power. The plasma antenna 91, the matching instrument 92 and the power source 93 constitute plasma generation means.

A flow controller 94 is connected to the other end of the passage 90, and a source gas containing chlorine as a halogen (a $Cl_2$ gas diluted with He to a chlorine concentration of $\leq 50\%$, preferably about 10%) is supplied into the passage 90 via the flow controller 94. By shooting electromagnetic waves from the plasma antenna 91 into the excitation chamber 95, the $Cl_2$ gas is ionized to generate a $Cl_2$ gas plasma (source gas plasma) 96. This means the construction of excitation means by which the source gas containing chlorine is excited in the excitation chamber 95 isolated from the chamber 81. Because of the generation of the $Cl_2$ gas plasma 96, excited chlorine is fed toward the composite metal plate member 101 (upper portion) within the chamber 81 through the opening portions 89, whereupon the composite metal plate member 101 is etched with excited chlorine.

At the time of film formation in the above-described metal film production apparatus, the $Cl_2$ gas plasma 96 is generated in the excitation chamber 95, and the $Cl_2$ gas plasma 96 is introduced through the opening portions 89 into the chamber 81 in which the temperature conditions for the composite metal plate member 101 and the substrate 3 have been adjusted as predetermined. Thus, the composite metal plate member 101 is etched in the same manner as for the metal film production apparatus shown in FIG. 8, etc., whereby a thin composite metal film 103 consisting of Cu and In can be formed on the surface of the substrate 3.

In the present embodiment as well, Cl* is formed with a high efficiency in the excitation chamber 25, and supplied for replenishment into the chamber 81 to dissociate Cl in the equations (3) and (4), promoting the film formation reaction. On the other hand, the Ar gas is supplied into the chamber 81 through the nozzles 30 to dissociate the $Cl_2$ gas in the equations (5) and (6), promoting the film formation reaction.

With the metal film production apparatus according to the present embodiment, moreover, the composite metal plate member 101 may be produced from a composite metal such as CuInSe2, CdS or ZnSe. Thus, a thin film of any of these composite metals can be prepared.

The source gas radical supply means in each of the embodiments is the coiled plasma antenna 26 wound round the tubular excitation chamber 25, Cl* is formed within the excitation chamber 25, and the Cl* is supplied for replenishment into the chamber 1 or the like. However, the source gas radical supply means is not limited to this construction. It suffices that radicals (e.g. Cl*) of the source gas (e.g. $Cl_2$ gas) can be separately formed, and supplied for replenishment into the chamber. For example, the source gas radical supply means of the following constructions can be conceived:

1) A construction which has microwave supply means in the tubular passage communicating with the interior of the chamber for flowing the source gas, and which converts the source gas into a plasma by microwaves generated by the microwave supply means. This construction can be easily achieved by using, for example, a magnetron. In this case, a frequency of about 2.45 (GHz) can be used. Incidentally, the frequency supplied to the plasma antenna 26 in each of the embodiments is 13.56 (MHz). Thus, the use of microwaves enables source gas radicals of a higher density to be formed.

2) A construction which has heating means for heating the source gas flowing through the tubular passage communicating with the interior of the chamber to dissociate the source gas thermally. A heater formed from a filament can be thought of as the heating means, and such a heater easily obtains a temperature of 1,500° C. or higher which is necessary for thermal dissociation. Thus, source gas radical replenishment means can be constructed most inexpensively.

3) A construction which has electromagnetic wave generation means for supplying electromagnetic waves, such as laser light or electron beams, to the source gas flowing through the tubular passage communicating with the interior of the chamber to dissociate the source gas. The electromagnetic wave generation means can fix the wavelength of laser light or electron beams at a specific value, thereby generating the desired radicals (e.g. Cl*) at a high efficiency, namely selectively generating the desired radicals at a high efficiency.

In the respective embodiments, the rare gas supply means is provided, as means for increasing the dissociation rate of the $Cl_2$ gas, in order to promote the film formation reaction expressed by the equations (2), (5) and (6). Instead, however, electromagnetic waves may be supplied into the chamber 1 or the like to dissociate the $Cl_2$ gas. That is, electromagnetic waves of such a wavelength as to dissociate the source gas (e.g., $Cl_2$ gas), for example, laser light at 200 nm to 350 nm, may be supplied above the substrate 3. This feature can be easily achieved by utilizing a laser oscillator for emitting laser light in the ultraviolet region, such as an excimer laser or a YAG laser.

Furthermore, to increase the dissociation rate in an attempt to promote the film formation reaction expressed by the equations (2), (5) and (6), it is effective to control the plasma conditions in the following manner:

1) To decrease the amount of the source gas (e.g. $Cl_2$ gas) supplied. In this case, the amount of its precursor is also decreased, thus making it necessary to sacrifice the film formation rate somewhat. However, this type of control is theoretically possible. If the respective embodiments are taken as examples, a decrease of about 10% from the standard amount of supply is appropriate in view of the film formation rate. That is, if the standard amount of supply of a $Cl_2$ gas is 50 (sccm), a decrease to about 45 (ccm) is appropriate.

2) To increase the amount of a high frequency power to the film forming plasma antenna for generating a plasma within the chamber 1 or the like. If the standard power is 22 (W/cm$^2$), for example, it is increased to 30 (W/cm$^2$).

The metal film production apparatus according to each of the embodiments has been described as an apparatus which fulfills both the requirements for promoting the film formation reaction in the equations (1), (3) and (4) and the requirements for promoting the film formation reaction in the equations (2), (5) and (6). Needless to say, however, it may be constructed as an apparatus for promoting one of the film formation reactions. Moreover, an Ar gas is separately supplied in order to increase the dissociation rate for promoting the film formation reaction according to the equations (2), (5) and (6). However, if an He gas is used as a diluent gas for the source gas (e.g. $Cl_2$ gas), the Ar gas may replace the He gas. In this case, the Ar gas concurrently serves the function of a diluent gas for the source gas, and the function of a film formation promoting gas for increasing the dissociation rate.

In the respective embodiments, the source gas has been described, with the $Cl_2$ gas diluted with He taken as an example. However, the $Cl_2$ gas can be used alone, or an HCl gas can also be applied. When the HCl gas is applied, an HCl gas plasma is generated as the source gas plasma. In this case, a precursor formed by etching of an etched member made of copper is $Cu_xCl_y$. In the case of the etched member comprising a composite metal, on the other hand, the precursor is $Cu_{x1}Cl_{y1}$, $In_{x2}Cl_{y2}$, or a chloride of Se or S. Thus, the source gas may be any gas containing chlorine, and a gas mixture of an HCl gas and a $Cl_2$ gas is also usable. Generally, chlorine is not restrictive, and any halogen gas can be used as the source gas in the present invention.

Moreover, the material for the etched member is not limited to copper. For example, a metal forming a high vapor pressure halide, such as Ta, Ti, W, Zn, In or Cd, can be similarly used. In this case, the precursor is a chloride (halide) of Ta, Ti, W, Zn, In or Cd, and a thin film formed on the surface of the substrate 3 is that of Ta, Ti, W, Zn, In or Cd.

Furthermore, a composite metal containing a plurality of these metals, for example, an alloy of In and Cu, can be used as the etched member. Besides, a composite metal containing a nonmetallic element, such as S or Se, in addition to any of the above metals, for example, an alloy such as $CuInSe_2$, CdS or ZnSe, can be used as the etched member. In this case, the resulting precursor is composed of a metal chloride and a chloride of the nonmetallic element, and a thin film of the composite metal is formed on the surface of the substrate 3.

In all of the embodiments, the supply of source gas radicals for replenishment has been described. However, radicals of the source gas need not always be supplied for replenishment depending on the film formation conditions, etc. Nevertheless, the supply of separately formed radicals of the source gas can result in an increased film formation speed and an improved film quality.

Tenth Embodiment

Figure 13:
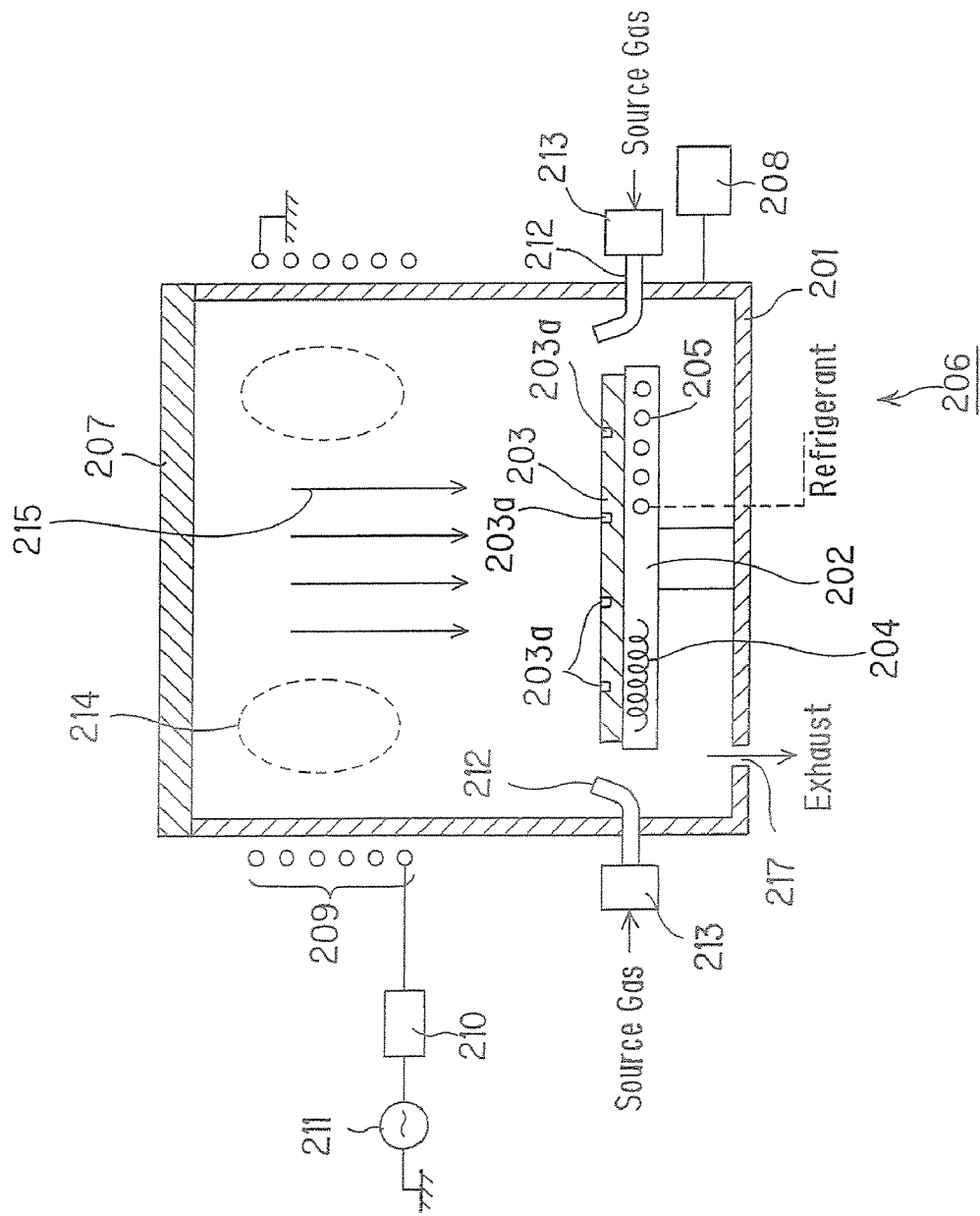
FIG. 13 is a schematic side view of an interconnection structure forming apparatus according to a tenth embodiment of the present invention.

FIG. 13 is a schematic side view of an interconnection structure forming apparatus according to a tenth embodiment of the present invention. As shown in FIG. 13, a support platform 202 is provided near the bottom of a cylindrical chamber 201 made of, say, a ceramic (an insulating material), and a substrate 203 is placed on the support platform 202. Depressions 203a, comprising trenches or holes, are formed in the substrate 203. A Cu film is stacked in each of the depressions to form a predetermined interconnection structure.

Temperature control means 206 equipped with a heater 204 and refrigerant flow-through means 205 is provided in the support platform 202 so that the support platform 202 is controlled to a predetermined temperature by the temperature control means 206.

An upper surface of the chamber 201 is an opening, which is closed with a copper plate member 207, as an etched member made of a metal. The interior of the chamber 201 closed with the copper plate member 207 is maintained at a predetermined vacuum pressure by a vacuum device 208.

A film forming plasma antenna 209 of a coiled shape is disposed around a cylindrical portion of the chamber 201 beside the copper plate member 207 in such a manner as to be wound in the axial direction of the chamber 201. A matching instrument 210 and a power source 211 are connected to the film forming plasma antenna 209 to supply power. Film forming plasma generation means is constituted by the film forming plasma antenna 209, matching instrument 210 and power source 211.

Nozzles 212 for supplying a source gas containing chlorine (a $Cl_2$ gas diluted with He to a chlorine concentration of 50%, preferably about 10%) are disposed in the interior of the chamber 201 above the support platform 202. The nozzle 212 is open toward the copper plate member 207, and the nozzle 212 is fed with the source gas via a flow controller 213. The source gas is conveyed from beside the substrate 203 toward the copper plate member 207 along the wall surface within the chamber 201 at the time of film formation. The amount of the $Cl_2$ gas supplied into the chamber 201 is controlled by the flow controller 213.

A mode of film formation in the foregoing interconnection structure forming apparatus is as described below.

While the source gas is supplied through the nozzles 212 into the chamber 201, electromagnetic waves are shot from the film forming plasma antenna 209 into the chamber 201, whereby the $Cl_2$ gas is ionized to generate a $Cl_2$ gas plasma (source gas plasma) 214. The $Cl_2$ gas plasma 214 is formed in a space adjacent to the film forming plasma antenna 209 in the interior of the chamber 201, namely, in a space, beside the copper plate member 207 (upper portion) within the chamber 201. On this occasion, Cl* also occurs.

The $Cl_2$ gas plasma 214 causes an etching reaction to the copper plate member 207, forming a precursor ($Cu_xCl_y$) 215. At this time, the copper plate member 207 is maintained by the $Cl_2$ gas plasma 214 at a predetermined temperature (e.g., 200 to 400° C.) which is higher than the temperature of the substrate 203.

The precursor ($Cu_xCl_y$) 215 formed within the chamber 201 is transported to the substrate 203 controlled to a lower temperature than the temperature of the copper plate member 207. The precursor ($Cu_xCl_y$) 215 transported to and adsorbed onto the substrate 203 deposits Cu on the substrate 203 in accordance with the reaction of the aforementioned equation (1) representing the film formation reaction. As a result, a thin Cu film (not shown) is formed on the surface of the substrate 203. The thin Cu film formed on the surface of the substrate 203 is simultaneously etched with Cl*. The intensity of this etching reaction depends on the density of Cl*. In the present embodiment, therefore, the amount of Cl* is appropriately controlled, thereby creating an atmosphere in which the speed of the film formation reaction is slightly higher than the speed of the etching reaction. By this means, the Cu film is deposited by the film formation reaction, and simultaneously the surface of the Cu film is etched, while the film thickness is gradually increased to bury the Cu film in the depressions 203a. Control of the density of Cl* can be easily exercised by controlling the flow controller 213 to regulate the amount of the $Cl_2$ gas supplied into the chamber 201 through the nozzles 212.

Consequently, in the interconnection structure formed by the apparatus according to the present embodiment, even if the depression 203a of the substrate 203 is a via hole with a very small diameter, for example, Cu can be sequentially stacked, starting at its bottom, to form the Cu film. At this time, the surface of the stacked Cu film is etched with Cl*. Thus, stacking of the Cu film proceeds, with the intrinsic surface of the Cu film being always exposed, and with the crystal directions being unified into a single direction.

Hence, the Cu film, which is buried in the depressions 203a by film formation in the copresence of the film formation reaction and the etching reaction, is satisfactory in the adhesion of the film itself, and also comprises a single crystal-like crystal. Such a single crystal-like crystal has no grain boundaries, or has several grain boundaries, if any. Thus, the Cu film is not affected by electromigration or stress migration, but can maintain stable electrical characteristics for a long period.

Figure 14A:
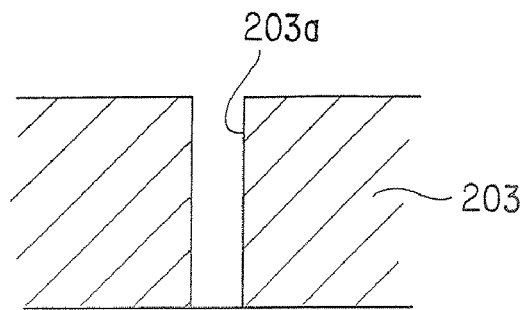
FIGS. 14($a$) to 14($c$) are cross-sectional views showing the process of formation of an interconnection structure formed by the apparatus illustrated in FIG. 13, and FIG. 14($d$) is a cross-sectional view showing an interconnection structure formed by an earlier technology.
Figure 14B:
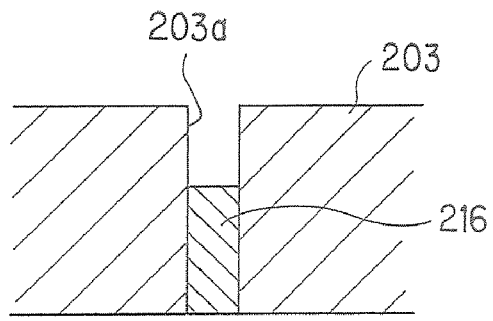
Figure 14C:
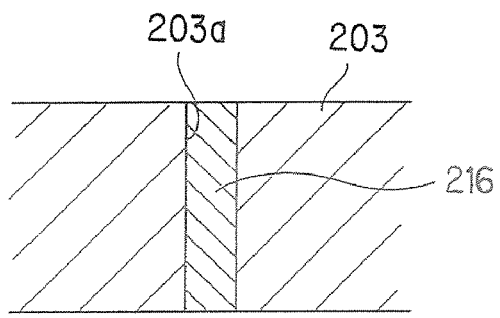
Figure 14D:
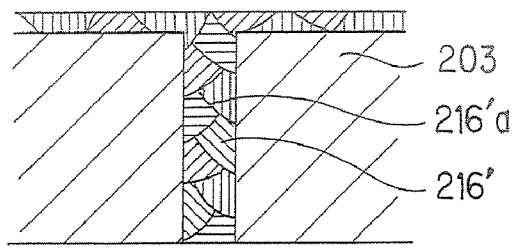

As shown in FIGS. 14(a) to 14(c) as cross-sectional views of the process for formation of the Cu film, this process begins with the initial state shown in FIG. 14(a). Then, a Cu film 216 is gradually stacked, staring at the bottom of the depression 203a, toward an opening (upward), whereby an interconnection structure comprising the Cu film 216 as the single crystal-like crystal is formed. FIG. 14(d) is a cross-sectional view schematically showing an interconnection structure obtained by the earlier technology. As shown in this drawing, a Cu film 216' comprises small crystal grains, and thus has many grain boundaries 216'a.

The film formation conditions in this process are, for example, as follows: The temperature of the substrate 203 is 160 to 200° C. If the temperature is lower than 160° C., a Cu film cannot be deposited. At a temperature higher than 200° C., the etching reaction is predominant, and no Cu film is deposited. The power density supplied to the film forming plasma antenna 209 is 22 ($W/cm^2$). The flow rate of the $Cl_2$ gas supplied is 50 to 120 (sccm). Control is exercised so that the film formation reaction speed>the etching reaction speed in view of the depth of the depression 203.

As described above, the creation of an atmosphere in which the speed of the film formation reaction is slightly higher than the speed of the etching reaction can be easily achieved by utilizing the following phenomenon which occurs in the apparatus shown in FIG. 13.

Figure 15:
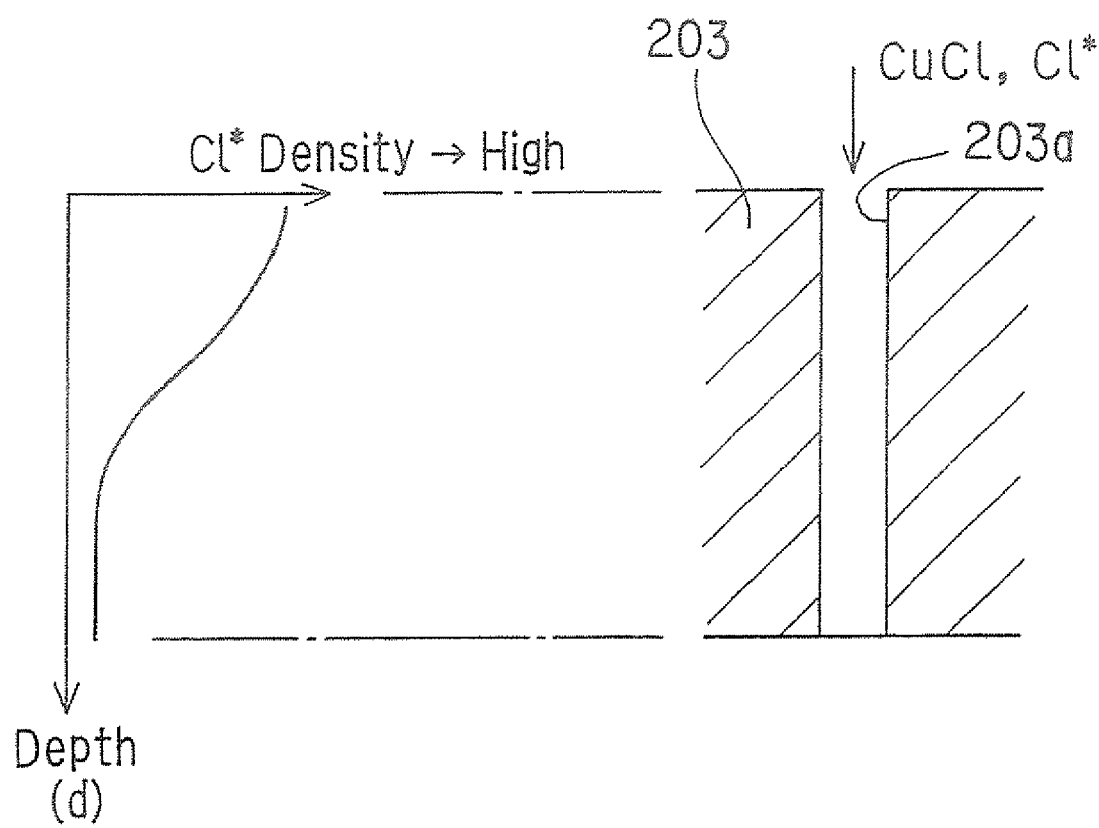
FIG. 15 is a characteristic diagram showing the general density characteristics of Cl*, relative to the depth direction of a depression 203$a$ of a substrate 203 in the apparatus illustrated in FIG. 13, in depth position relationship with the depression 203$a$ of the substrate 203.

FIG. 15 is a characteristic diagram showing the general density characteristics (a curve indicated by a solid line in FIG. 15) of Cl*, relative to the depth direction of the depression 203a of the substrate 203 in the apparatus illustrated in FIG. 13, in depth position relationship with the depression 203a of the substrate 203. As shown in the drawing, the density of Cl* decreases with increasing depth of the depression 203a toward its bottom. The reason is that Cl*, which has entered the depression 203a, collides with the surface of the depression 203a and vanishes by the time when it arrives at the bottom of the depression 203a. That is, the closer to the bottom of the depression 203a Cl* comes, the higher the probability that the reaction expressed by Cl*+Cl*→$Cl_2$ occurs. Thus, Cl* vanishes accordingly, making the density of Cl* lower. On the other hand, the precursor ($Cu_xCl_y$) 215 can easily arrive at the bottom of the depression 203a. Thus, it can be generally said that the closer to the bottom the site is, the more predominant the film formation reaction becomes. That is, if the film formation conditions, such as the concentration of the $Cl_2$ gas, are appropriately controlled, the boundary between the film formation reaction region and the etching reaction region gradually ascends toward the opening of the depression 203a. Thus, the Cu film 216 can be stacked, with the intrinsic surface being always exposed.

Figure 16A:
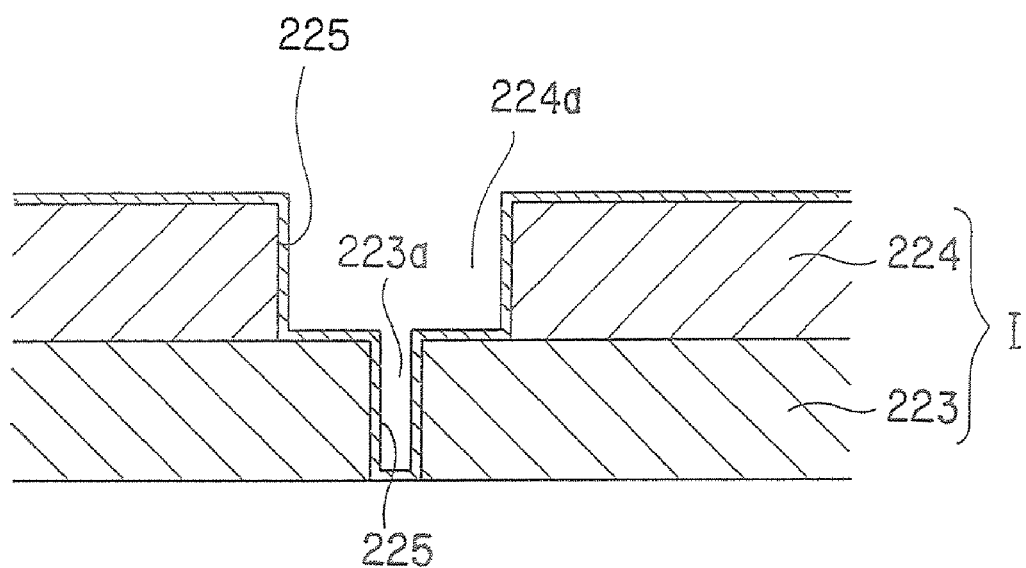
FIGS. 16($a$) and 16($b$) are cross-sectional views showing a multilayer (two-layer in this embodiment) interconnection structure formed by the apparatus of FIG. 13.
Figure 16B:
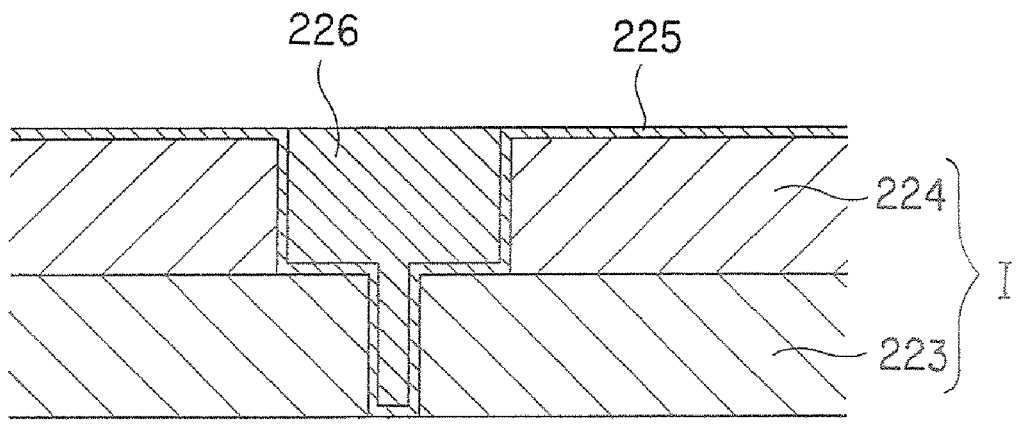

FIGS. 16(a) and 16(b) are cross-sectional views showing a multilayer (two-layer in this embodiment) interconnection structure formed by controlling the film formation speed and the etching speed as described above in the apparatus of FIG. 13. As shown in FIG. 16(a), this multilayer interconnection structure comprises a substrate I comprising a substrate 223 of an insulator (e.g., $SiO_2$) having a depression 223a, for example, a via hole, formed therein, another substrate 224 laminated on the substrate 223, and a depression 224a, a trench for interconnection, formed in the substrate 224. On the surface of the substrate I, a commonly used barrier metal layer 225 is formed for satisfactorily ensuring adhesion to an interconnection material (Cu). The material for the barrier metal layer 225 is, for example, TaN.

When the above substrate I is accommodated in the apparatus shown in FIG. 13 and the apparatus is driven under the above-mentioned conditions, a Cu film 226 is gradually stacked at the bottom of a depression 223a shown in FIG. 16(a) under the conditions such that the film formation reaction speed>the etching reaction speed. As a result, an interconnection structure reaching the depression. 224a is integrally formed. That is, an integral interconnection structure as shown in FIG. 16(b) can be formed. Cu, forming such an interconnection structure, is a single crystal-like crystal ranging from the depression 223a to the depression 224a.

At a time when the depression 224a is completely filled with the Cu film 226 upon burial, the amount of the $Cl_2$ gas supplied is increased to render the etching reaction predominant. By this means, the CMP step in the damascene method concerned with the earlier technology can be omitted, because the predominance of the etching reaction precludes the formation of the Cu film 226 on the surface of the substrate 224 (to be exact, the surface of the barrier metal layer 225).

Such a desired multilayer interconnection structure can be formed in a very short time with a dramatically decreased number of the production steps as compared with the conventional method. For comparison, an explanation will be offered for the steps of forming the multilayer interconnection structure shown in FIG. 16(b) by the double damascene method according to the earlier technology.

Figure 17A:
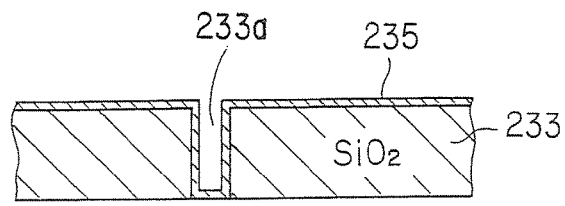
FIGS. 17($a$) to 17($f$) are cross-sectional views showing an interconnection structure in each of steps for forming a multilayer interconnection structure by the double damascene method according to the earlier technology.

1) Prepare a substrate 233 having a barrier metal layer 235, as well as a depression 233a, formed therein (see FIG. 17(a)).

Figure 17B:
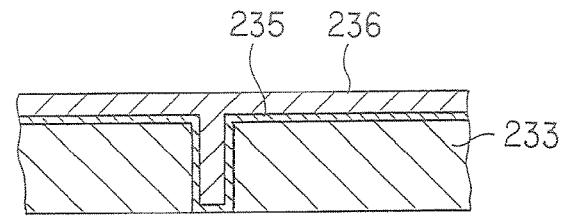

2) Form a Cu film 236 on the surface of the substrate 233, including the depression 233a, by vapor phase deposition or plating (see FIG. 17(b)).

Figure 17C:
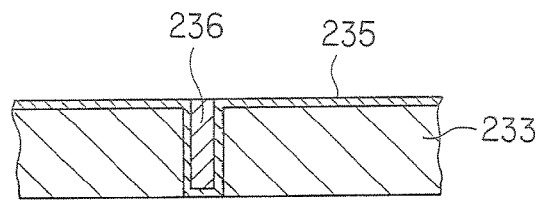

3) Remove the Cu film 236, except that in the depression 233a, by CMP (see FIG. 17(c)).

Figure 17D:
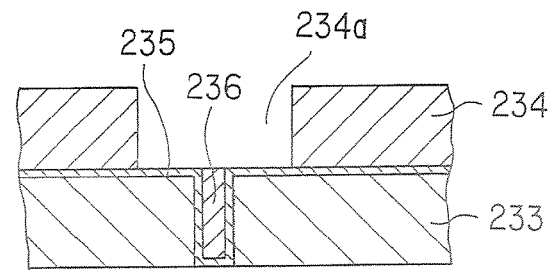

4) Form a substrate 234, another insulating layer, and process it to form a depression 234a such as an interconnection trench (see FIG. 17(d)).

Figure 17E:
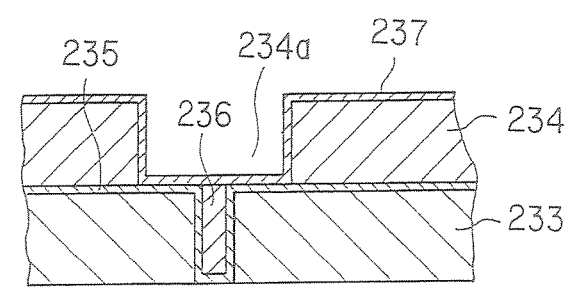

5) Form a barrier metal layer 237 on the surface of the substrate 234, including the depression 234a (see FIG. 17(e)).

Figure 17F:
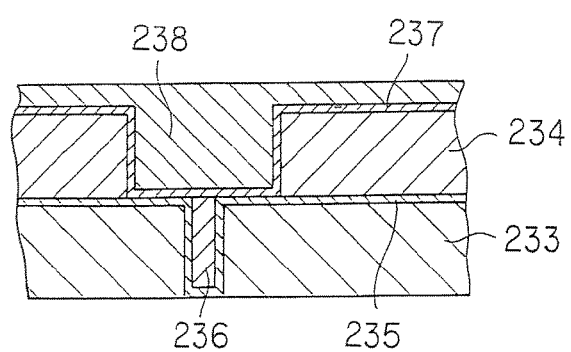

6) Form a Cu film 238 on the surface of the substrate 234, including the depression 234a, by vapor phase deposition or plating (see FIG. 17(f)).

7) Then, remove the Cu film 238, except that in the depression 234a, by CMP.

According to the earlier technology, the above-described many steps 1) to 7) are required. With the aforementioned embodiment of the present invention, on the other hand, after the substrate I of the multilayer structure having the barrier metal layer 225 formed therein, as shown in FIG. 16(a), is formed, the desired multilayer interconnection structure can be formed in one step. In this respect alone, the production time can be reduced dramatically.

In forming the single-layer interconnection structure by the single damascene method, the earlier technology requires the steps 1) to 3) of the above-described steps. In other words, the CMP step needs to be performed once. According to the present embodiment, on the other hand, even when the single-layer interconnection structure is to be formed, the CMP step can be omitted as stated earlier to shorten the production time.

In the aforementioned multilayer interconnection structure according to the present embodiment, moreover, the Cu film 226 buried in the depression 223a and the Cu film 226 buried in the depression 224a are not separated from each other by the barrier metal layer 225. In the multilayer structure according to the earlier technology shown in FIGS. 17(a) to 17(f), by contrast, the barrier metal layer 237 is formed on the upper surface of the Cu film 236, which has been buried in the depression 233a, by the step shown in FIG. 17(e). Unless this barrier metal layer 237 is removed separately, the barrier metal layer 237 exists between the Cu film 236 buried in the depression 233a and the Cu film 238 buried in the depression 234a. Usually, the barrier metal layer 237 is formed from a high resistor, such as TaN, having resistivity about two orders of magnitude greater than Cu. With the conventional structure, therefore, the low-resistance Cu films 236 and 238 are connected by the high-resistance barrier metal layer 237. As a result, the electrical performance of the multilayer interconnection structure is deteriorated. This problem can be solved at the same time by the multilayer interconnection structure according to the present embodiment.

It goes without saying that the interconnection structure forming apparatus, which forms the interconnection structure according to the present invention or finds use in the method for forming the interconnection structure, is not limited to the interconnection structure forming apparatus according to the embodiment shown in FIG. 13. The apparatus may be any apparatus which etches the etched member formed from a copper plate or the like with a source gas plasma within the chamber to form a precursor comprising a metallic element and a source gas, and controls the temperatures of the etched member and the substrate so as to be predetermined temperatures and to have a temperature difference therebetween, thereby depositing the metallic element of the precursor on the substrate to form a film. The reason is that a metal film can be stacked in a depression of the substrate, starting at its bottom, under the conditions such that the film formation reaction speed>the etching reaction speed. Thus, the apparatus may be not only an apparatus which supplies the source gas into the chamber and forms a plasma within the chamber, but also an apparatus which supplies a separately formed source gas plasma into the chamber.

In the respective embodiments, the source gas has been described, with the $Cl_2$ gas diluted with He taken as an example. However, the $Cl_2$ gas can be used alone, or an HCl gas can also be applied. When the HCl gas is applied, an HCl gas plasma is generated as the source gas plasma. In this case, a precursor formed by etching of the etched member made of copper is $Cu_xCl_y$. Thus, the source gas may be any gas containing chlorine, and a gas mixture of an HCl gas and a $Cl_2$ gas is also usable. Generally, chlorine is not restrictive, and any halogen gas can be used as the source gas in the present invention.

While the present invention has been described in the foregoing fashion, it is to be understood that the invention is not limited thereby, but may be varied in many other ways. Such variations are not to be regarded as a departure from the spirit and scope of the invention, and all such modifications as would be obvious to one skilled in the art are intended to be included within the scope of the appended claims.

What is claimed is:

1. A process for forming a metal film, comprising the steps of:
   accommodating a substrate having a depression and a metal member in a chamber, an atmosphere of which is exhausted;
   generating a plasma gas containing halogen radical derived from a gas which comprises halogen atoms to etch the metal member so that a reaction product comprising metal of the metal member and the halogen atoms is produced;
   heating the substrate at a temperature so as to deposit a metal film comprising the metal which is separated from the reaction product on the substrate;
   wherein a mass of the halogen radical is controlled so that the metal film is selectively deposited in the depression prior to formation of a non-depression surface of the substrate.

2. The method according to claim 1, wherein the halogen radical is chlorine radical.

3. The method according to claim 1, wherein the metal is Cu, Ta, Ti or W.

4. The method according to claim 1, wherein the depression comprises a plurality of depressions of different diameters.

5. The method according to claim 1, wherein the metal film, formed on the substrate from the metal separated from the reaction product through a reduction by the halogen radical, is etched by the halogen radical.

* * * * *